(12) United States Patent
Kim et al.

(10) Patent No.: US 9,853,048 B2
(45) Date of Patent: Dec. 26, 2017

(54) MEMORY DEVICE AND METHOD OF MANUFACTURING THE SAME

(71) Applicant: SAMSUNG ELECTRONICS CO., LTD., Suwon-si, Gyeonggi-do (KR)

(72) Inventors: Ki Jeong Kim, Hwaseong-si (KR); O Ik Kwon, Yongin-si (KR); Jong Kyoung Park, Suwon-si (KR); Su Jee Sunwoo, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/226,329

(22) Filed: Aug. 2, 2016

(65) Prior Publication Data

US 2017/0077137 A1 Mar. 16, 2017

(30) Foreign Application Priority Data

Sep. 10, 2015 (KR) ........................ 10-2015-0128350

(51) Int. Cl.
| | | |
|---|---|---|
| *H01L 29/76* | (2006.01) | |
| *H01L 29/788* | (2006.01) | |
| *H01L 27/11582* | (2017.01) | |
| *H01L 27/11565* | (2017.01) | |
| *H01L 21/768* | (2006.01) | |
| *H01L 21/311* | (2006.01) | |
| *H01L 27/11575* | (2017.01) | |

(52) U.S. Cl.
CPC .. *H01L 27/11582* (2013.01); *H01L 21/31144* (2013.01); *H01L 21/76802* (2013.01); *H01L 21/76877* (2013.01); *H01L 27/11565* (2013.01); *H01L 27/11575* (2013.01)

(58) Field of Classification Search
None
See application file for complete search history.

(56) References Cited

U.S. PATENT DOCUMENTS

| | | | |
|---|---|---|---|
| 8,563,378 B2 | 10/2013 | Shim et al. | |
| 8,633,099 B1 | 1/2014 | Shih et al. | |
| 8,901,745 B2 | 12/2014 | Hwang et al. | |
| 8,912,593 B2 | 12/2014 | Matsuda | |
| 2002/0149977 A1 | 10/2002 | Oh | |
| 2009/0230449 A1* | 9/2009 | Sakaguchi | .......... H01L 27/0688 257/298 |

(Continued)

FOREIGN PATENT DOCUMENTS

| | | |
|---|---|---|
| KR | 2002-0072846 A | 9/2002 |
| KR | 10-0687863 B1 | 2/2007 |
| KR | 10-2009-0109353 A | 10/2009 |

*Primary Examiner* — Andy Huynh
*Assistant Examiner* — Sitaramarao S Yechuri
(74) *Attorney, Agent, or Firm* — Lee & Morse, P.C.

(57) ABSTRACT

A memory device includes a plurality of gate electrode layers, an interlayer insulating layer, a plurality of contact plugs, and at least one contact insulating layer. The gate electrode layers extend in a first direction and have different lengths to form a step structure. The interlayer insulating layer is on the gate electrode layers. The contact plugs are connected to the gate electrode layers through the interlayer insulating layer. The at least one contact insulating layer is within the interlayer insulating layer and surrounds one or more of the contact plugs. The at least one contact insulating layer extends in the first direction.

16 Claims, 31 Drawing Sheets

(56) References Cited

U.S. PATENT DOCUMENTS

| | | | |
|---|---|---|---|
| 2010/0207240 A1* | 8/2010 | Hashimoto | H01L 27/11575 257/532 |
| 2011/0193153 A1* | 8/2011 | Higuchi | H01L 27/11578 257/324 |
| 2013/0161835 A1 | 6/2013 | Chen et al. | |
| 2013/0270714 A1* | 10/2013 | Lee | H01L 21/76802 257/774 |
| 2013/0341797 A1 | 12/2013 | Lim | |
| 2014/0199815 A1* | 7/2014 | Hwang | H01L 29/66833 438/270 |
| 2014/0306279 A1 | 10/2014 | Park et al. | |
| 2015/0064902 A1 | 3/2015 | Park et al. | |
| 2015/0069496 A1* | 3/2015 | Shiga | H01L 27/11582 257/324 |
| 2015/0340371 A1* | 11/2015 | Lue | H01L 21/28282 257/324 |

\* cited by examiner

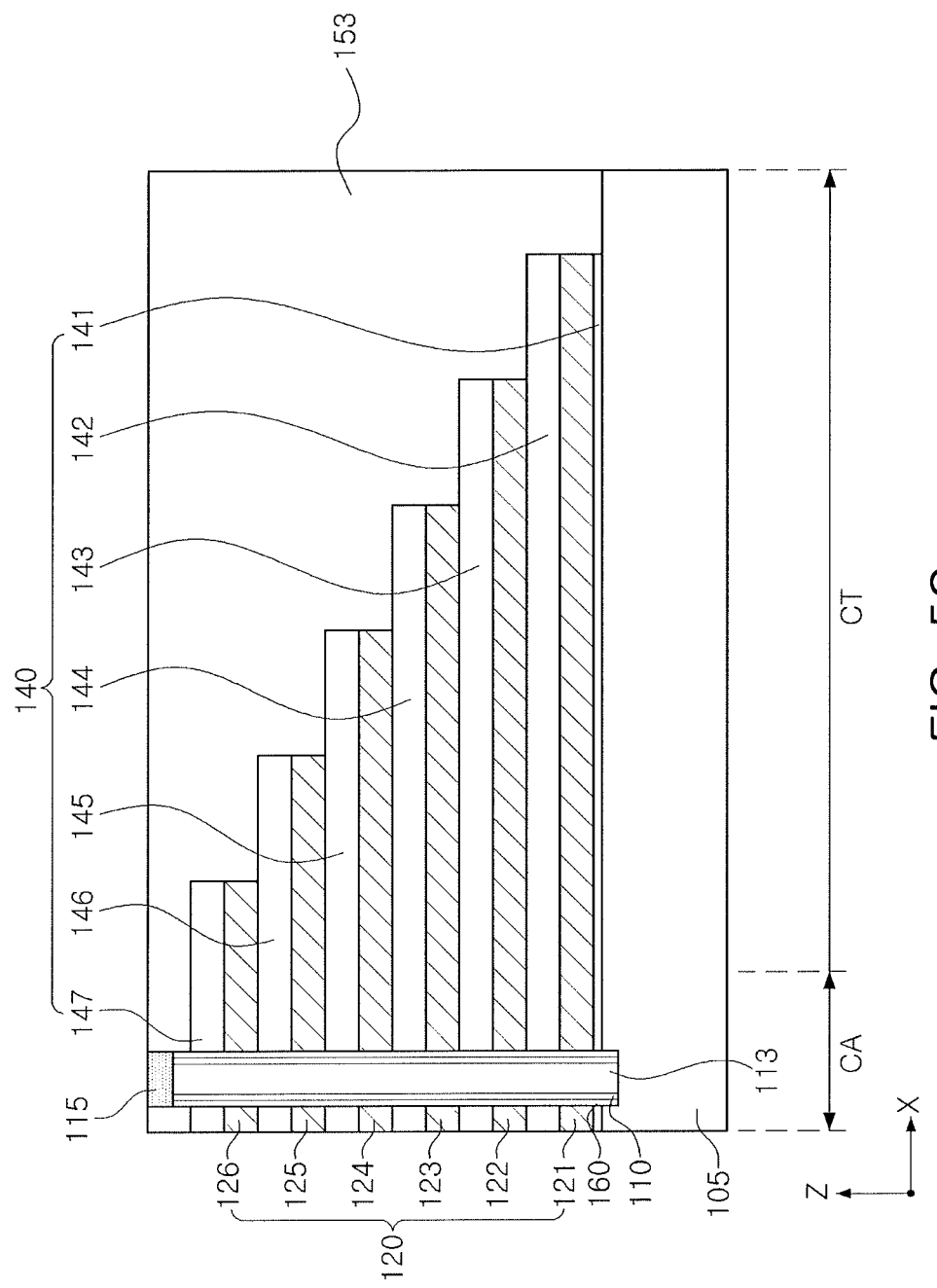

MEMORY DEVICE AND METHOD OF MANUFACTURING THE SAME

CROSS-REFERENCE TO RELATED APPLICATION

Korean Patent Application No. 10-2015-0128350, filed on Sep. 10, 2015, and entitled, "Memory Device and Method of Manufacturing the Same," is incorporated by reference herein in its entirety.

BACKGROUND

1. Field

One or more embodiments described herein relate to a memory device and a method for manufacturing a memory device.

2. Description of the Related Art

Efforts are being made to increase the processing capabilities of electronic devices, while at the same time decrease their size. This may involve increasing the degree of integration of semiconductor memory devices. Various attempts have been made to increase the degree of integration of semiconductor memory devices. One attempt involves designing a memory device to have a vertical transistor structure.

SUMMARY

In accordance with one or more embodiments, a memory device includes a plurality of gate electrode layers extending in a first direction, the gate electrode layers having different lengths on a substrate to form a step structure; an interlayer insulating layer on the gate electrode layers; a plurality of contact plugs connected to the gate electrode layers through the interlayer insulating layer; and at least one contact insulating layer within the interlayer insulating layer and surrounding one or more of the contact plugs, the at least one contact insulating layer extending in the first direction.

The at least one contact insulating layer may extend along the contact plugs to contact the gate electrode layers. The at least one contact insulating layer may include a plurality of first regions surrounding outer surfaces of the contact plugs, and a plurality of second regions connecting the first regions to each other. The first regions may be arranged in a row in the first direction. The first regions may be arranged in a zigzag pattern in the first direction.

The memory device may include a plurality of recesses, wherein each of the recesses has a shape corresponding to a shape of an outer surface of the at least one contact insulating layer and wherein the recesses are in upper portions of the gate electrode layers. Depths of the recesses may be substantially equal. The memory device may include a plurality of contact insulating layers within the interlayer insulating layer and surrounding the contact plugs, wherein the contact plugs are arranged in a plurality of rows in the first direction.

In accordance with one or more embodiments, a memory device includes a plurality of gate electrode layers extending in a first direction, the gate electrode layers having different lengths on a substrate to form a step structure; an interlayer insulating layer on the gate electrode layers; a plurality of contact plugs connected to the plurality of gate electrode layers through the interlayer insulating layer; at least one contact insulating layer within the interlayer insulating layer, surrounding one or more of the contact plugs, and extending in the first direction; and a plurality of dummy channel columns adjacent to first ends of the gate electrode layers. The dummy channel columns may be arranged in a plurality of rows in the first direction.

In accordance with one or more other embodiments, a method for manufacturing a memory device includes forming gate electrode layers extending in a first direction, the gate electrode layers having different lengths on a substrate to form a step structure; forming an interlayer insulating layer on the gate electrode layers; removing at least a portion of the interlayer insulating layer to form an opening, the opening including first opening regions and a second opening region connecting the first opening regions to each other and exposing the gate electrode layers; partially filling the opening with an insulating layer to form contact holes; and filling the contact holes with a conductive material to form contact plugs.

The method may include forming a mask pattern including first pattern regions and second pattern regions on the interlayer insulating layer, the first pattern regions disposed to correspond to positions of the contact holes and the second pattern regions connecting the first pattern regions to each other and extending in the first direction, the mask pattern formed before forming the opening. Each of the second pattern regions may have a predetermined width and extend in the first direction, and a width of each of the first pattern regions may be greater than the predetermined width of the second pattern regions.

Forming the contact holes may include forming an insulating layer on a side wall of the opening in such a manner that the first opening regions are partially filled and the second opening regions are entirely filled; and etching back the insulating layer to expose the gate electrode layers within the first opening regions. A thickness of the insulating layer, with respect to the side wall of the opening, may be greater than half of a width of each of the second opening regions and less than half of each of the first opening regions.

In accordance with one or more other embodiments, a method of manufacturing a memory device includes forming a step structure including an alternating arrangement of gate electrode layers and first insulating layers; forming a second insulating layer on the step structure, the second insulating layer including first areas and second areas, the first areas having different heights over ends of the step structure and the second areas between respective pairs of the first areas; and filling the first areas with conductive material to form contact plugs. The second areas may have substantially equal heights greater than the different heights of the first areas.

The method may include forming a third insulating layer on the step structure before forming the second insulating layer on the step structure; and removing a portion of the third insulating layer to form an opening overlapping the ends of the step structure, wherein the second insulating layer is formed in the opening. The first areas may have first widths, and the second areas may have second widths less than the first widths.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
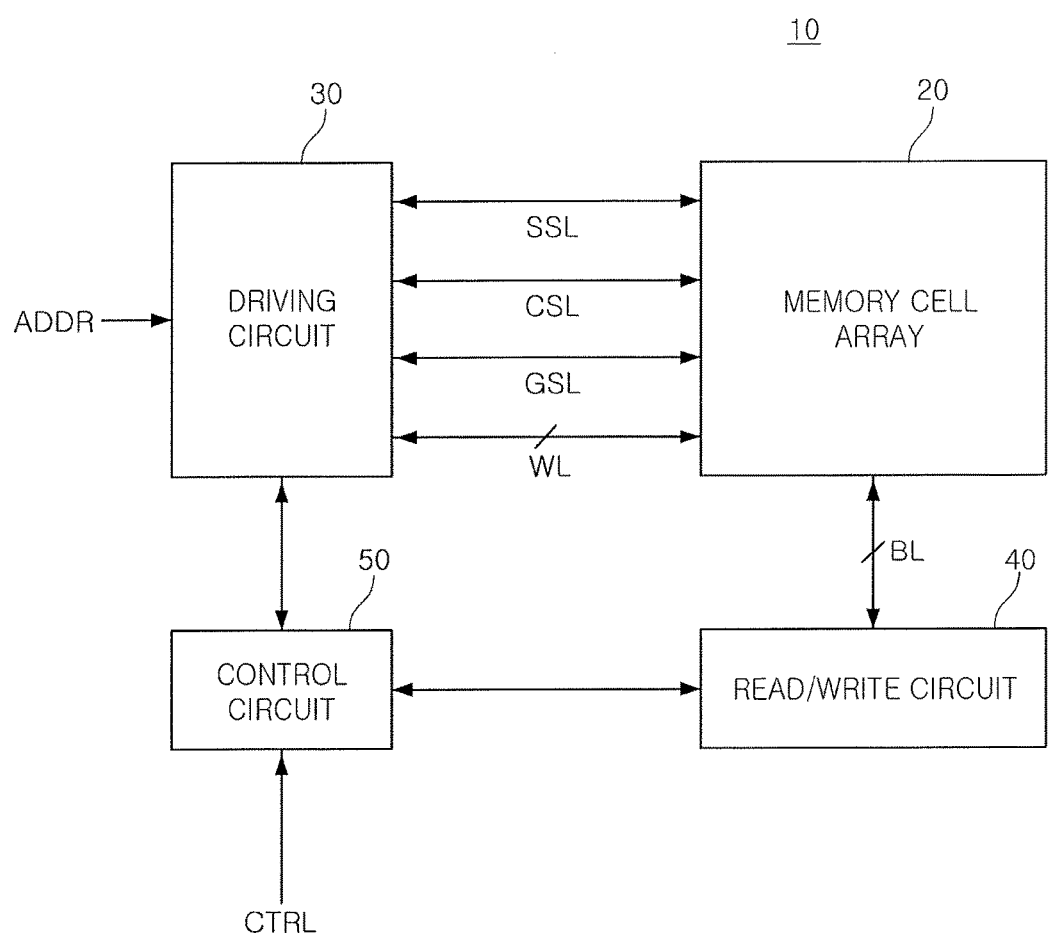
FIG. 1 illustrates an embodiment of a memory device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

In the drawings, for example, due to manufacturing techniques and/or tolerances, modifications of the shape shown may be estimated. Thus, embodiments of the present inventive concept should not be construed as being limited to the particular shapes of regions shown herein, for example, to include a change in shape results in manufacturing. The following embodiments may also be constituted by one or a combination thereof.

FIG. 1 illustrates an embodiment of a memory device 10 which includes a memory cell array 20, a driving circuit 30, a read/write circuit 40, and a control circuit 50. The memory device 10 may be a non-volatile memory device or another type of memory device.

The memory cell array 20 may include a plurality of memory cells arranged in rows and columns. The memory cells in the memory cell array 20 may be connected to the driving circuit 30 by a word line WL, a common source line CSL, a string select line SSL, a ground select line GSL, and the like, and may be connected to the read/write circuit 40 through a bit line BL. In an example embodiment, a plurality of memory cells arranged in the same row may be connected to the same word line WL, and a plurality of memory cells arranged in the same column may be connected to the same bit line BL.

The memory cells in the memory cell array 20 may be divided into a plurality of memory blocks. Each memory block may include a plurality of word lines WL, a plurality of string select lines SSL, a plurality of ground select lines GSL, a plurality of bit lines BL, and at least one common source line CSL.

The driving circuit 30 and the read/write circuit 40 may be operated by the control circuit 50. In an example embodiment, the driving circuit 30 may receive externally-supplied address information ADDR, decode the received address information ADDR, and select at least a portion of the word lines WL, common source lines CSL, string source lines SSL, or the ground select lines GSL connected to the memory cell array 20. The driving circuit 30 may include a driving circuit with respect to each of the word line WL, the string select line SSL, and the common source line CSL.

The read/write circuit 40 may select at least a portion of bit lines BL connected to the memory cell array 20 according to a command received from the control circuit 50. The read/write circuit 40 may read data stored in a memory cell connected to the selected at least a portion of the bit lines BL or write data to the memory cell connected to the selected at least a portion of the bit lines BL. In order to perform the foregoing operation, the read/write circuit 40 may include circuits such as a page buffer, an input/output buffer, and a data latch.

The control circuit 50 may control operations of the driving circuit 30 and the read/write circuit 40 in response to an externally transmitted control signal CTRL. When data stored in the memory cell array 20 is read, the control circuit 50 may control an operation of the driving circuit 30 to supply a voltage to a word line of a memory cell storing data to be read for a reading operation. When the voltage for a reading operation is supplied to a specific word line WL, the control circuit 50 may control the read/write circuit 40 to read data stored in a memory cell connected to the word line WL to which the voltage for a reading operation has been supplied.

When data is written to the memory cell array 20, the control circuit 50 may control the low decoder 30 to supply a voltage to a word line into data is to be written for a writing operation. When the voltage for a writing operation is supplied to a word line WL, the control circuit 50 may control the read/write circuit 40 to write data to a memory cell connected to the word line WL to which the voltage for a writing operation has been applied.

Figure 2:
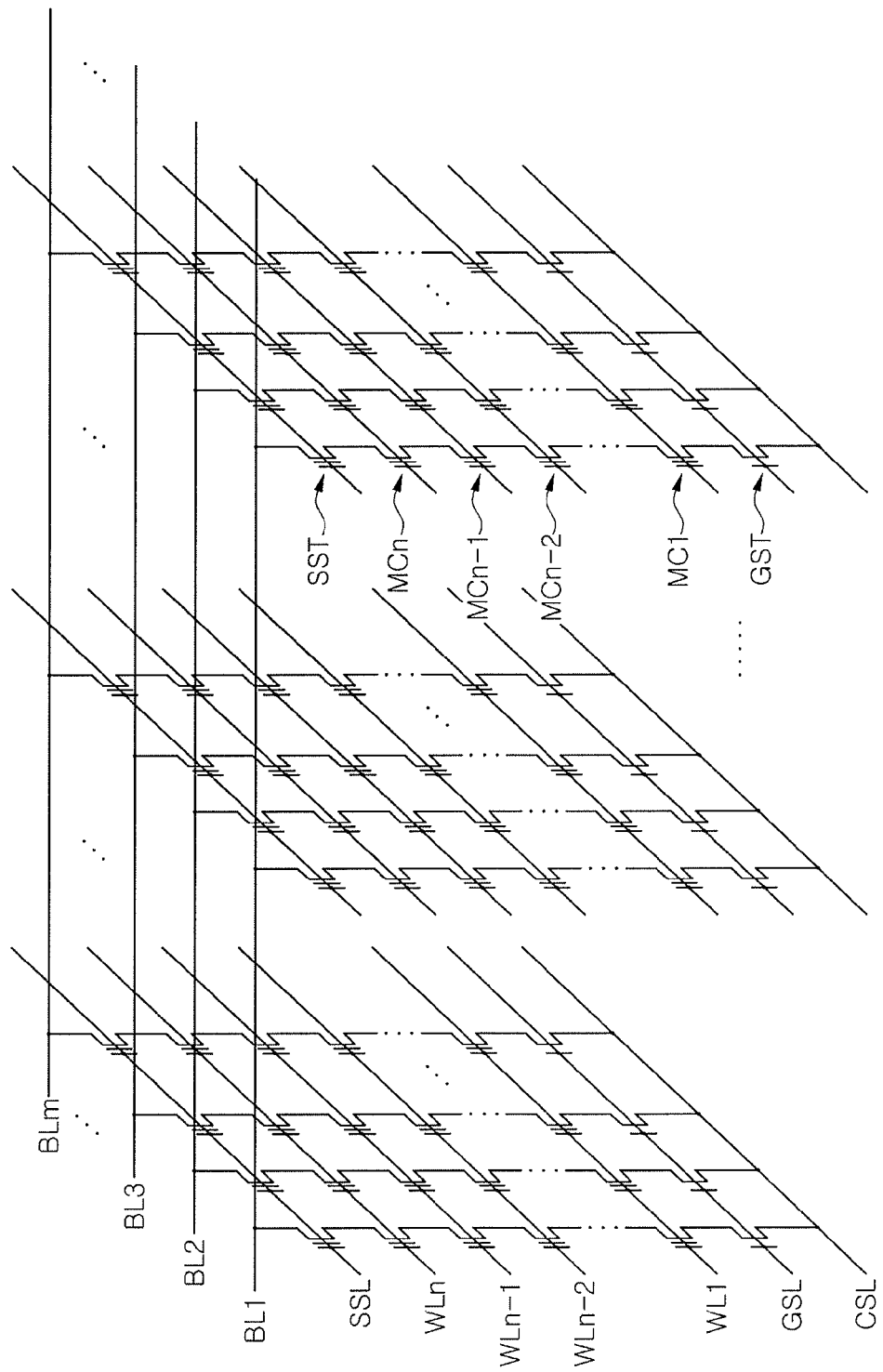
FIG. 2 illustrates an embodiment of a memory cell array.

FIG. 2 is an equivalent circuit diagram illustrating an embodiment a memory cell array, which, for example, may be included in the memory device. The equivalent circuit diagram illustrates that the memory cell array has a three-dimensional (3D) structure.

Referring to FIG. 2, the memory cell array may include a plurality of memory cell strings, each including n number of memory cell elements MC1 to MCn connected in series, and a ground select transistor GST and a string select transistor SST connected to respective ends of the memory cell elements MC1 to MCn. The n number of memory cell elements MC1 to MCn may be connected to word lines WL1 to WLn for respectively selecting at least a portion of the memory cell elements MC1 to MCn.

The ground select transistor GST has a gate terminal connected to the ground select line GSL and a source terminal connected to the common source line CSL. The string select transistor SST has a gate terminal connected to the string select line SSL and a source terminal connected to a drain terminal of the memory cell MCn. In this embodiment, a single ground select transistor GST and a single string select transistor SST are connected to the memory cell elements MC1 to MCn. In another embodiment, a plurality of ground select transistors GST and a plurality of string select transistors SST may be connected to the n number of memory cell elements MC1 to MCn.

The string select transistor SST has a drain terminal connected to the plurality of bit lines BL1 to BLm. When a signal is applied to the gate terminal of the string select transistor SST through the string select line SSL, a signal applied through the bit lines BL1 to BLm may be transferred to the n number of memory cell elements MC1 to MCn, to thereby perform a data reading operation or a data writing operation. Also, by applying a signal to the gate terminal of the ground select transistor GST having a source terminal connected to the common source line CSL through the gate select line GSL, an erasing operation may be executed to remove all electrical charges stored in the n number of memory cell elements MC1 to MCn.

Figure 3:
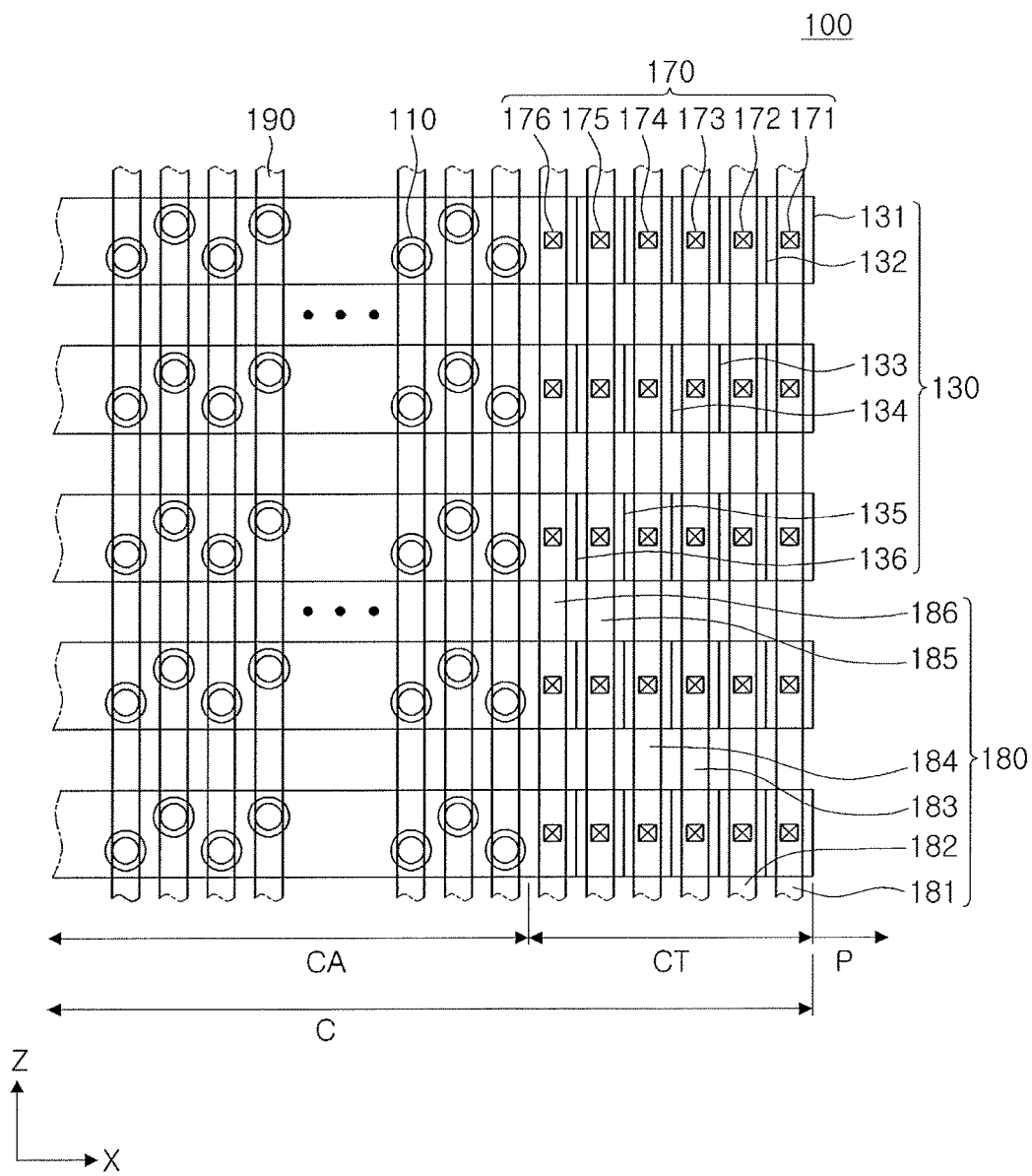
FIG. 3 illustrates a layout embodiment of a memory device.

FIG. 3 illustrates a layout embodiment of the memory device which may include a cell region C and a peripheral circuit region P. In an example embodiment, the cell region C may include a cell array region CA including a plurality of channel regions 110 and a connection region CT in which a plurality of gate electrode layers 131 to 136 (130) are connected to a plurality of contact plugs 171 to 176 (170). The peripheral circuit region P may be provided outside of the connection region CT of the cell region C. A plurality of circuit elements, for example, a plurality of transistors, may be in the peripheral circuit region P. A plurality of memory cells, a plurality of bit lines 190 electrically connected to the plurality of memory cells, and a plurality of gate electrode layers 130 may be in cell region C.

The gate electrode layers 130 may include a conductive material and may extend in one direction. In FIG. 3, the gate electrode layers 130 extend in the x-axis direction and the bit lines 190 extend in a different direction (e.g., y-axis direction) intersecting the x-axis direction. In another embodiment, the gate electrode layers 130 and the bit lines 190 may extend in different directions.

The gate electrode layers 130 may be stacked in the z-axis direction perpendicular to the x-y plane to form a plurality of word lines. Some gate electrode layers 130 at the same height in the z-axis direction may be electrically connected by a plurality of connection lines 181 to 186 (180). In order to connect some gate electrode layer 130 at the same height in the z-axis direction through the connection lines 180, a plurality of contact plugs 170 extending in the z-axis direction may be provided.

A plurality of channel regions 110 may be disposed in a predetermined (e.g., zigzag) pattern in the gate electrode layers 130 and may be electrically connected to the bit lines 190. By disposing the channel regions 110 in the zigzag pattern in the gate electrode layer 130, the number of the channel regions 110 in the gate electrode layers 130 may be increased. The gate electrode layers 130 may be separate in the y-axis direction to form a plurality of gate stack. In the gate stack, the channel regions 110 may be arranged in two rows in the x-axis direction. The disposition or arrangement of the channel regions 110 may be different in another embodiment. For example, in the gate stack, the channel regions 110 may be arranged in four rows or nine rows in the x-axis direction (see, e.g., FIGS. 12 and 13).

The connection region CT is between the cell array region CA and the peripheral circuit region P. The connection region CT may include a plurality of gate electrode layers 130 extending from the cell array region CA in one direction (e.g., x-axis direction) and a plurality of contact plugs 170 connected to the gate electrode layers 130. The gate electrode layers 130 may extend in one direction such that lengths thereof are progressively shortened by predetermined amounts from the gate electrode 131 in the lowermost layer to gate electrode 136 in the uppermost layer in the z-axis direction. Since the lengths of the gate electrode layers 130 extending in one direction are progressively shortened from the gate electrode layer 131 of the lowermost layer to the gate electrode layer 136 of the uppermost layer, each of the gate electrode layers 130 may form a step with respect to adjacent gate electrode layers 130 in the stacking direction.

The peripheral circuit region P is disposed outwardly relative to the connection region CT. The peripheral circuit region P may include circuits for driving the memory cells and circuits for reading information stored in the memory cells.

Figure 4:
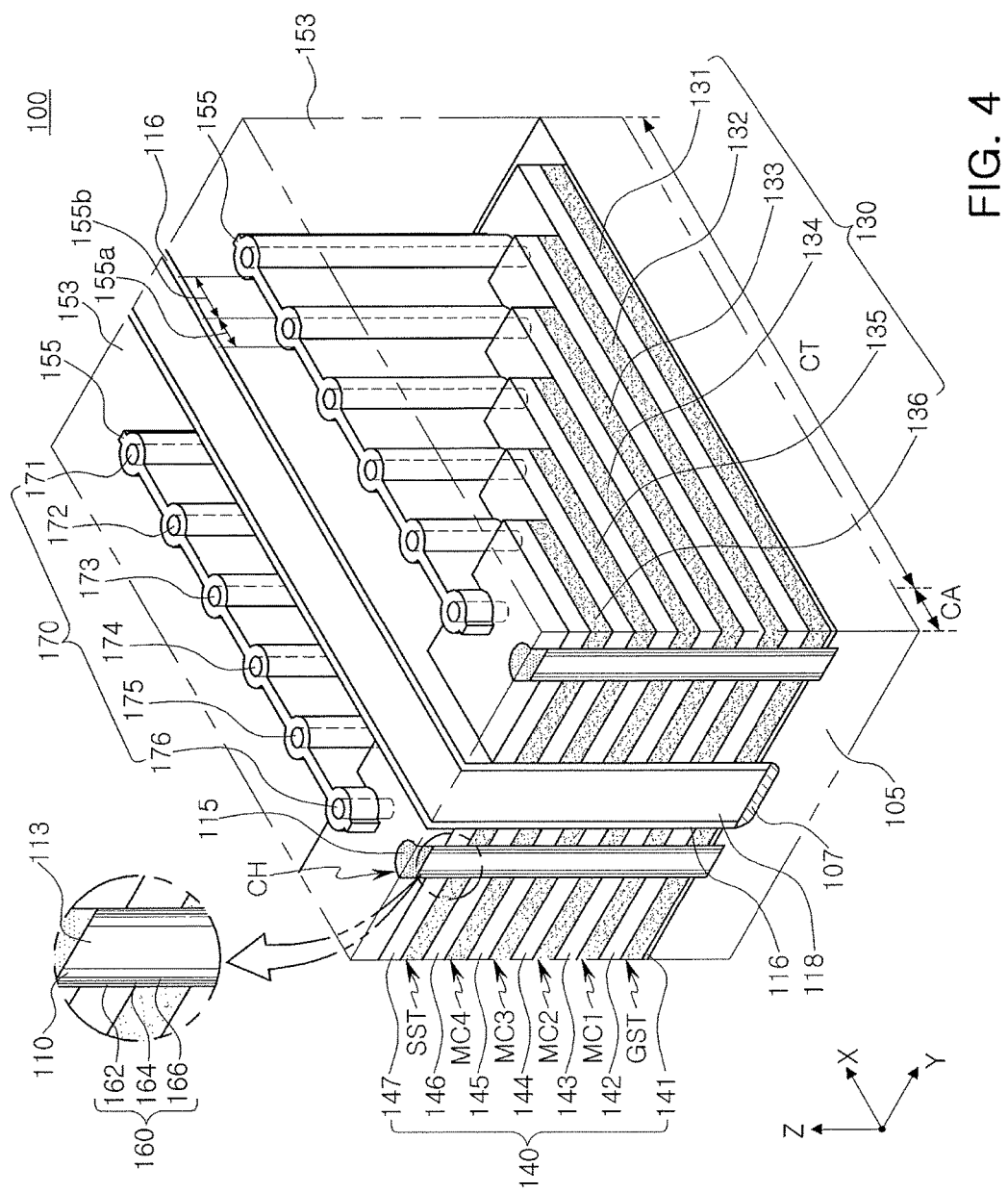
FIG. 4 illustrates another view of the memory device.

FIG. 4 is a perspective view embodiment of the memory device. For convenience of explanation. some of the components in the cell region C in FIG. 3 may be omitted in FIG. 4. For example, the bit lines 190 and the connection line 180 in FIG. 3 are omitted in FIG. 4 in order to allow for improved explanation.

Referring to FIG. 4, the memory device 100 may include a substrate 105 that includes the connection region CT adjacent to the cell array region CA. The substrate 105 may have an upper surface extending in the x direction and the y direction. The substrate 105 may include a semiconductor material, for example, a Group IV semiconductor, a Group III-V compound semiconductor, or a Group II-VI compound semiconductor.

The memory device 100 may include a plurality of gate electrode layers 131 to 136 (130) stacked on the upper surface of the substrate 105 in the z axis direction and a plurality of insulting layers 141 to 147 (140) between the gate electrode layers 130. The gate electrode layers 130 and the insulating layers 140 may extend in one direction (e.g., in the x-axis direction in FIG. 4).

The cell array region CA includes channel columns CH extending in the z-axis direction in addition to the gate electrode layers 130 and the insulating layers 140. Each of the channel columns CH may include a channel region 110, a gate insulating layer 160, an embedded insulating layer 113, and a conductive layer 115. The channel region 110 may be formed within an opening having a predetermined (e.g., circular) cross-section. The embedded insulating layer 113 may be within the hollow annular channel region 110. The conductive layer 115 may be on the channel region 110. The bit line 190 (e.g., refer to FIG. 3) may be connected to the channel region 110 through the conductive layer 115.

The gate insulating layer 160 may include a blocking layer 162, an electric charge storage layer 164, and a tunneling layer 166 between the channel region 110 and the gate electrode layer 130. In the example embodiment illustrated in FIG. 4, the blocking layer 162, the electric charge storage layer 164, and the tunneling layer 166 are disposed outwardly of the channel region 110 and extend in the z-axis direction parallel to the channel region 110. In another embodiment, the blocking layer 162, the electric charge storage layer 164, and the tunneling layer 166 may surround the gate electrode layer 130. In one embodiment, a portion of the gate insulating layer 160 may extend in the z-axis direction parallel to the channel region 110, so as to be disposed on an outer side of the channel region 110. Another or the remaining portion of the gate insulating layer 160 may be surrounded by the gate electrode layer 130.

The blocking layer 162 may include a silicon oxide ($SiO_2$), a silicon nitride ($Si_3N_4$), a silicon oxynitride (SiON), or a high-k dielectric material. The high-k dielectric material may be any one of an aluminum oxide ($Al_2O_3$), a tantalum oxide ($Ta_2O_3$), a titanium oxide ($TiO_2$), a yttrium oxide ($Y_2O_3$), a zirconium oxide ($ZrO_2$), a zirconium silicon oxide ($ZrSi_xO_y$), a hafnium oxide ($HfO_2$), a hafnium silicon oxide ($HfSi_xO_y$), a lantana oxide ($La_2O_3$), a lantana aluminum oxide ($LaAl_xO_y$), a lantana hafnium oxide ($LaHf_xO_y$), a hafnium aluminum oxide ($HfAl_xO_y$), or a praseodymium oxide ($Pr_2O_3$). In at least one embodiment, the term "high-K" indicates that the permittivity of the blocking layer 162 is higher than that of the tunneling layer 166.

The blocking layer 162 may include a plurality of layers having different permittivities. By disposing a layer having relatively low permittivity closer to the channel region 130 than a layer having relatively high permittivity, an energy band (such as the height of a barrier) may be adjusted to enhance characteristics (e.g., erase characteristics) of the memory device 100.

The electric charge storage layer 164 may be an electrical charge trap layer or a floating gate conductive layer. When the electric charge storage layer 164 is a floating gate, the electric charge storage layer 164 may be formed by depositing polysilicon through low pressure chemical vapor deposition (LPCVD). When the electric charge storage layer 164 is an electrical charge trap layer, the electric charge storage layer 164 may include at least one of a silicon oxide ($SiO_2$), a silicon nitride ($Si_3N_4$), a silicon oxynitride (SiON), a hafnium oxide ($HfO_2$), a zirconium oxide ($ZrO_2$), a tantalum oxide ($Ta_2O_3$), a titanium oxide ($TiO_2$), a hafnium aluminum oxide ($HfAl_xO_y$), a hafnium tantalum oxide ($HfTa_xO_y$), a hafnium silicon oxide ($HfSi_xO_y$), an aluminum nitride ($Al_xN_y$), or an aluminum gallium nitride ($AlGa_xN_y$).

The tunneling layer 166 may include at least one of a silicon oxide ($SiO_2$), a silicon nitride ($Si_3N_4$), a silicon oxynitride (SiON), a hafnium oxide ($HfO_2$), hafnium silicon oxide ($HfSi_xO_y$), an aluminum oxide ($Al_2O_3$), or a zirconium oxide ($ZrO_2$).

The gate electrode layers 130 and the insulating layers 140 may be stacked in different positions in the z-axis direction and may extend to have different lengths in the x-axis direction to form a plurality of step pad regions in the connection region CT. In FIG. 4, the insulating layers 140 are higher than the gate electrode layers 130 in the z-axis direction. In one embodiment, the gate electrode layers 130 may be higher than the insulating layers 140.

A plurality of contact plugs 171 to 176 (170) may be in the pad regions of the connection region CT, respectively. The contact plugs 170 may be connected to the gate electrode layers 130 through an interlayer insulating layer 153 and the insulating layer 140. The contact plugs 170 may extend in the z-axis direction and may include a material having excellent conductivity. In an example embodiment, the contact plugs 170 may include the same material as the gate electrode layers 130. The contact plugs 170 in the same position in the x-axis direction may be electrically connected to each other by the connection lines 181 to 186 (180), for example, as illustrated in FIG. 3.

In the connection region CT, a contact insulating layer 155 may be formed to surround the contact plugs 170 and extend in the x-axis direction and the z-axis direction in order to electrically insulate the contact plugs 170. The contact insulating layer 155 may include first regions 155a surrounding an outer circumferential surface of the contact plug 170 and second regions 155b connecting the first regions 155a. The contact insulating layer 155 may extend along the contact plugs 170 in the z-axis direction in contact with the gate electrode layers 130. The contact insulating layer 155 may be formed of a material having electrical insulation properties. In an example embodiment, the contact insulating layer 155 may be formed of a material different from the interlayer insulating layer 153. For example, the interlayer insulating layer 153 may include silicon oxide and the contact insulating layer 155 may include silicon nitride or silicon oxynitride.

Recesses having a shape corresponding to a shape of the outer circumferential surface of the contact insulating layer 155 may be formed in upper portions of the gate electrode layers 130 in contact with the contact insulating layer 155.

Depths of the recesses may be substantially the same. In another embodiment, the depths of the recesses may be different.

A conductive layer 118 may be connected to the substrate 105 through the gate electrode layers 130 and the insulating layers 140 in the z-axis direction. The conductive layer 118 may extend in the x-axis direction, for example, to have a linear shape in the cell array region CA and the connection region CT. The gate electrode layers 130 and the insulating layers 140 may be divided into a plurality of gate stacks by the conductive layer 118. The conductive layer 118 may form a common source line (CSL). A source region 107 doped with an impurity may be below the conductive layer 118 in the substrate 105. The conductive layer 118 may include a metal, e.g., tungsten (W), aluminum (Al), copper (Cu), or another metal or alloy. An insulating layer 116 may be between the conductive layer 118 and the gate electrode layers 130. The gate electrode layers 130 and the conductive layer 118 may be electrically insulated from each other by the insulating layer 116.

The embodiment in FIG. 4 includes four memory cells MC1 to MC4, one string select transistor SST, and one ground select transistor GST. In another embodiment, the numbers of memory cells, string select transistors (SST), and/or ground select transistors (GST) may be different. Also, in FIG. 4, the memory cells MC1 to MC4, the string select transistor SST, and the ground select transistor (GST) have the same structure. In another embodiment, the string select transistor SST and/or the ground select transistor (GST) may have a structure different from those in the memory cells MC1 to MC4.

Figure 5A:
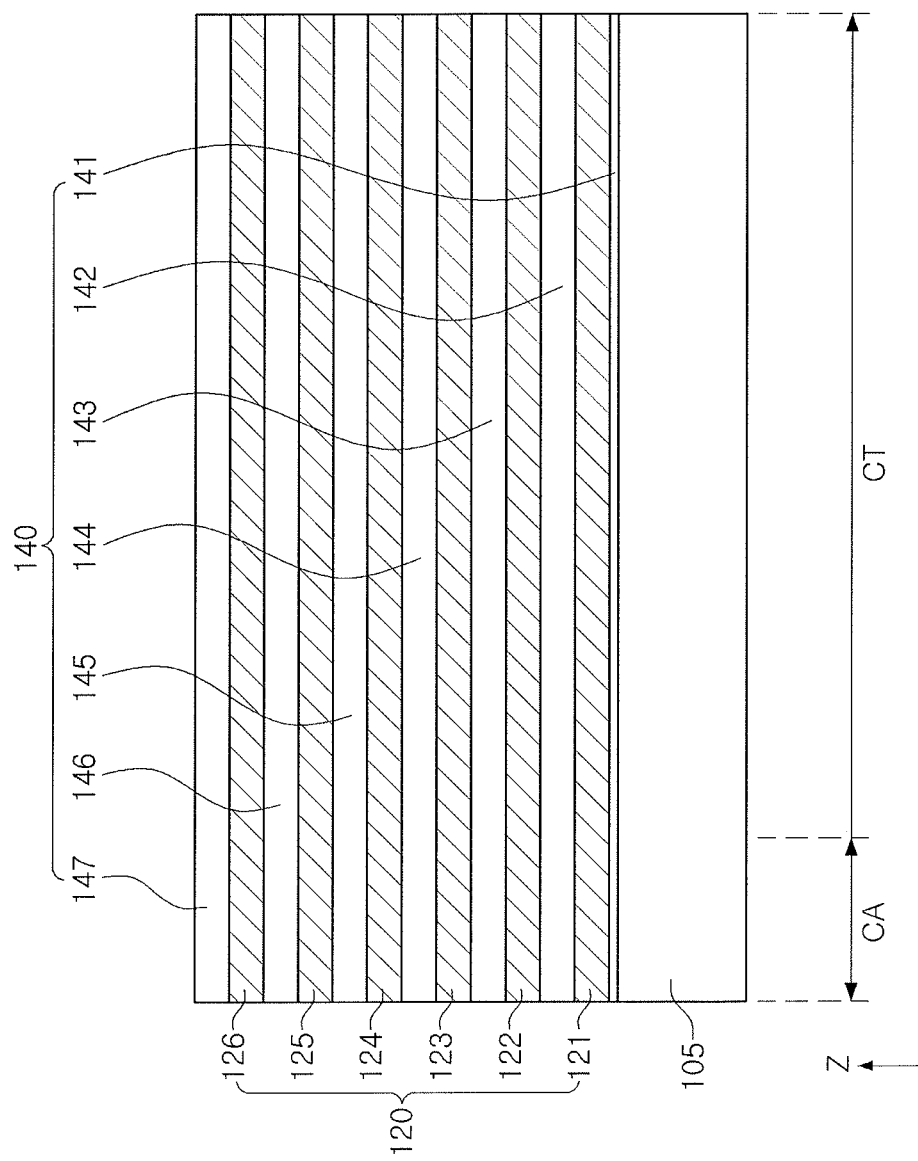
FIGS. 5A to 5P illustrate different stages of one embodiment of a method for manufacturing a memory device.
Figure 5B:
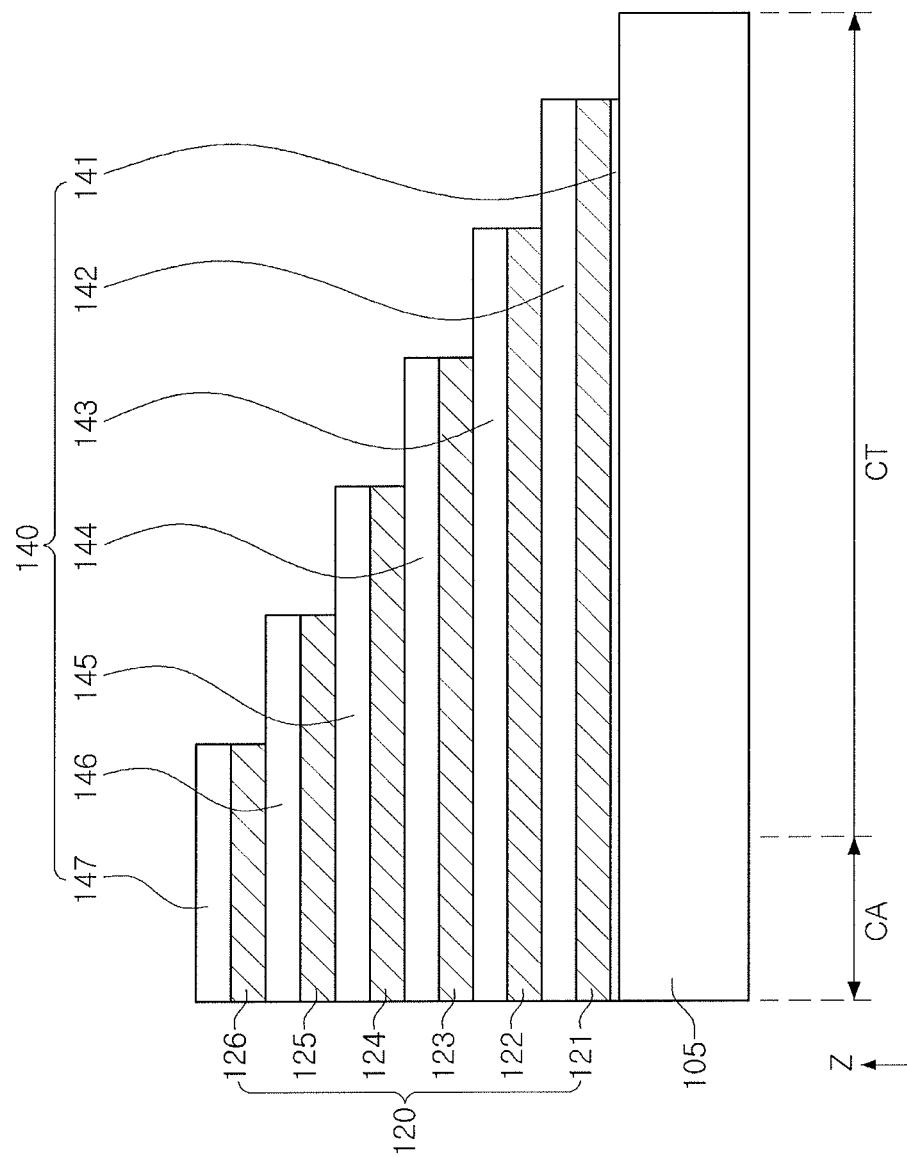
Figure 5D:
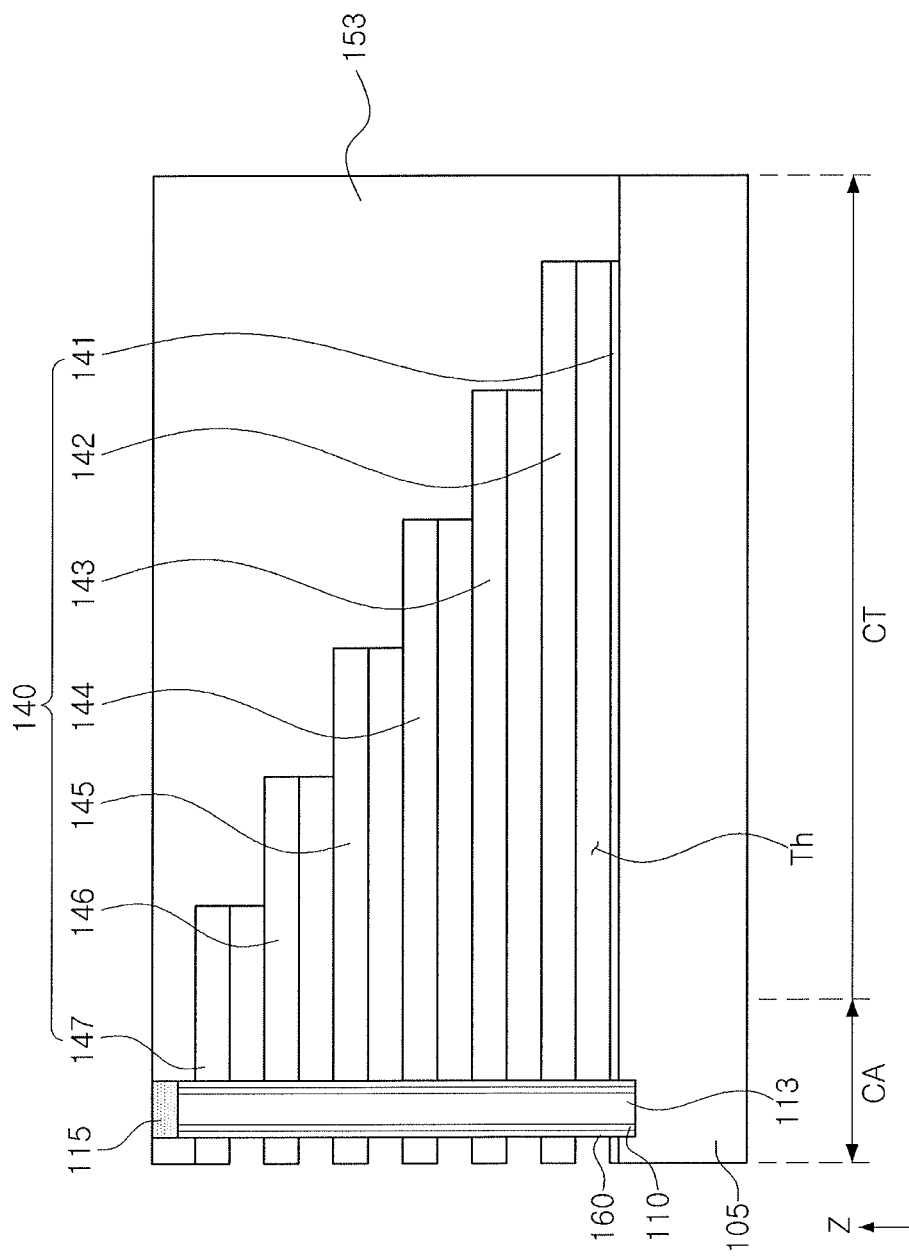
Figure 5E:
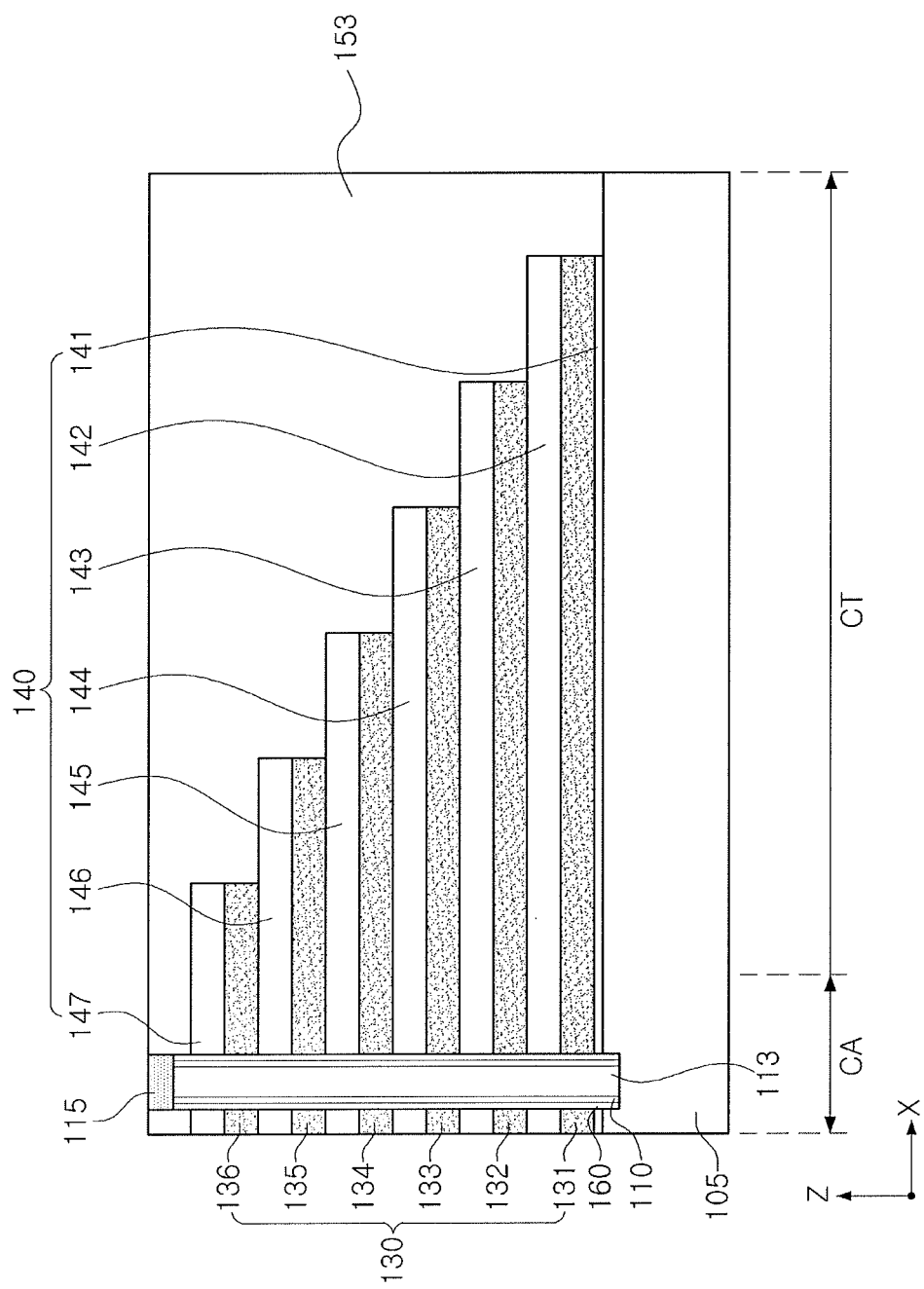
Figure 5F:
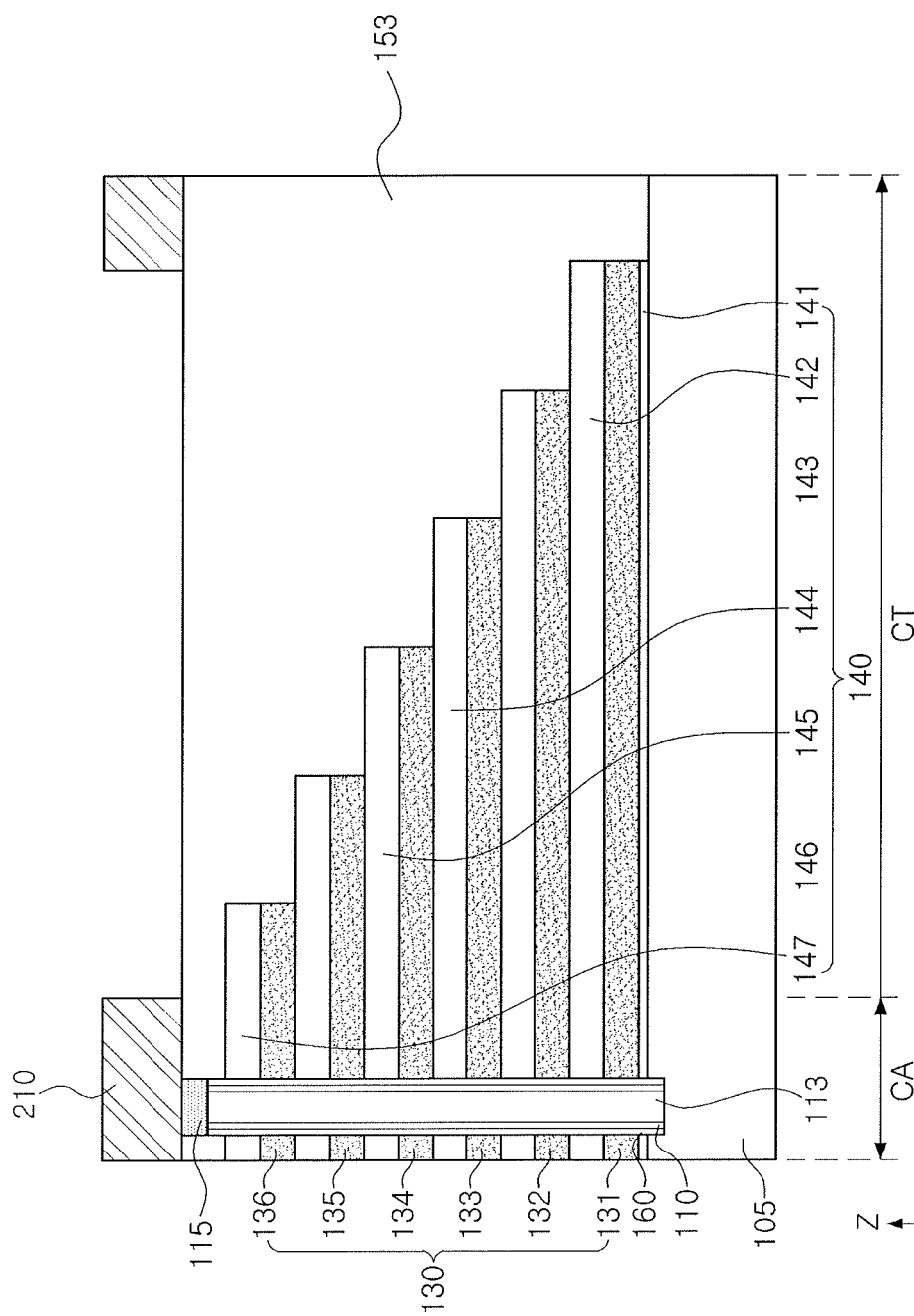
Figure 5G:
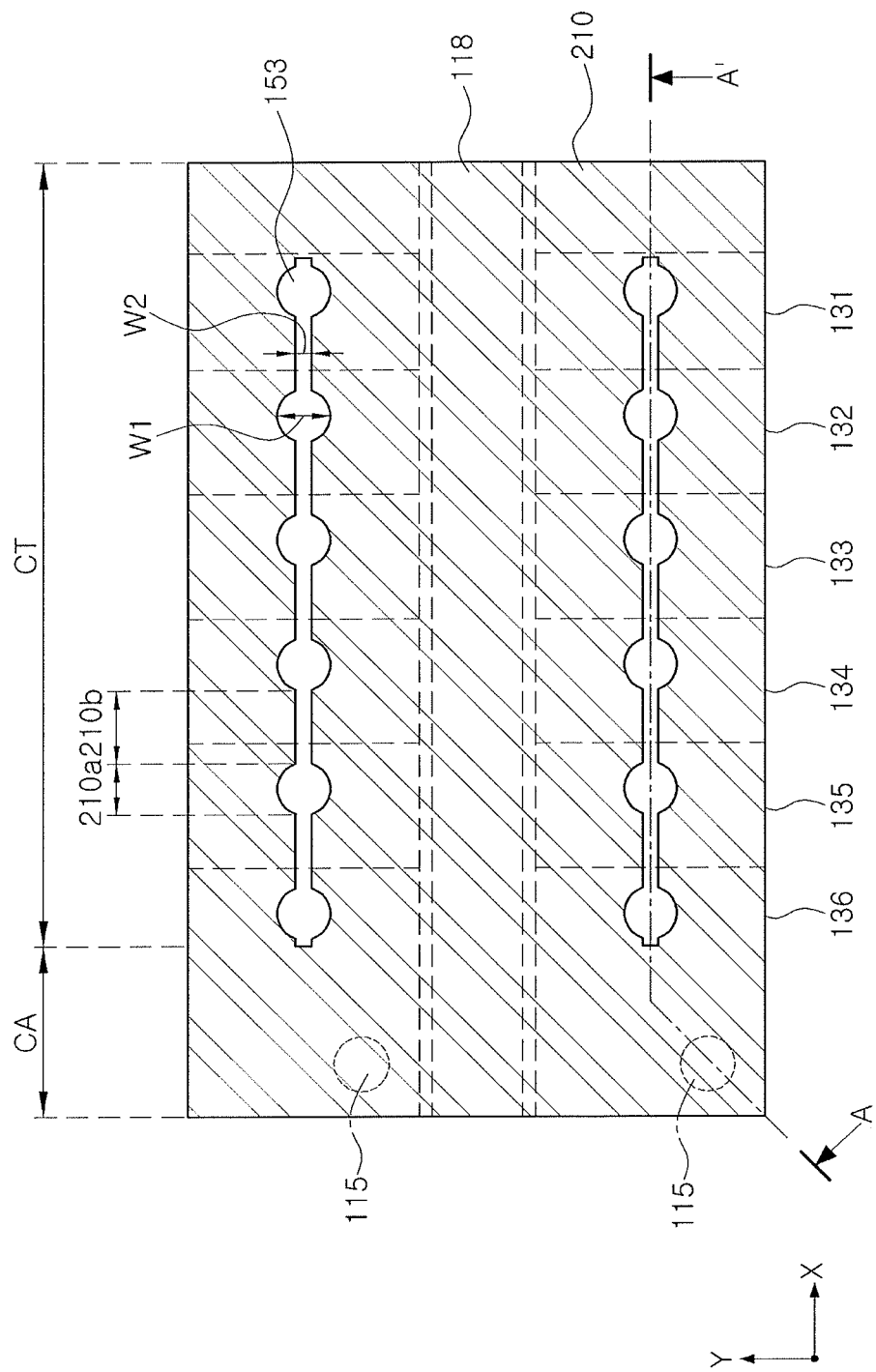
Figure 5H:
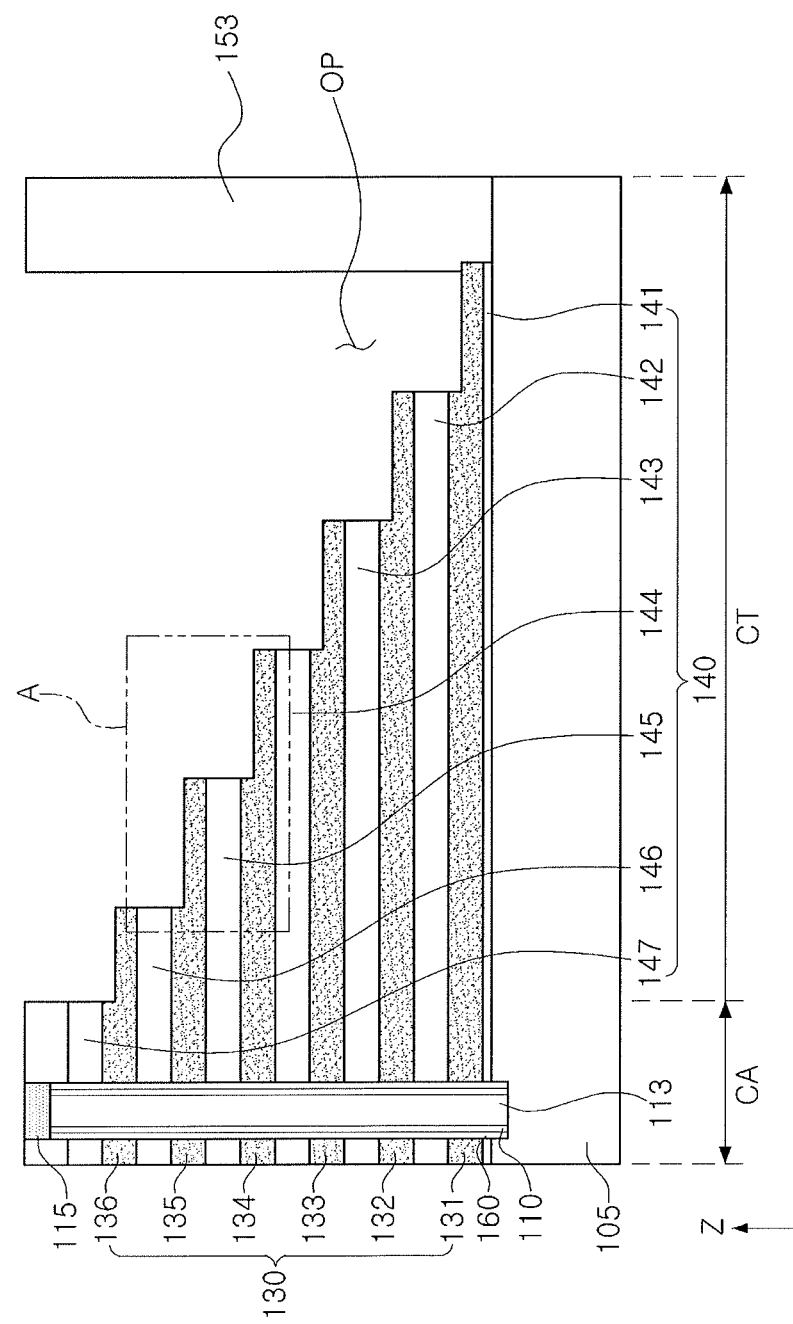
Figure 5I:
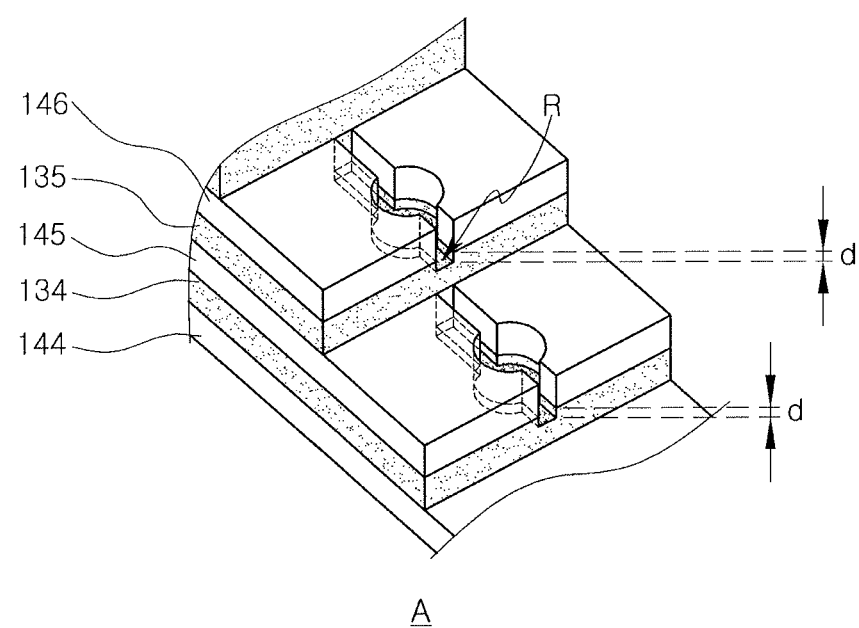
Figure 5J:
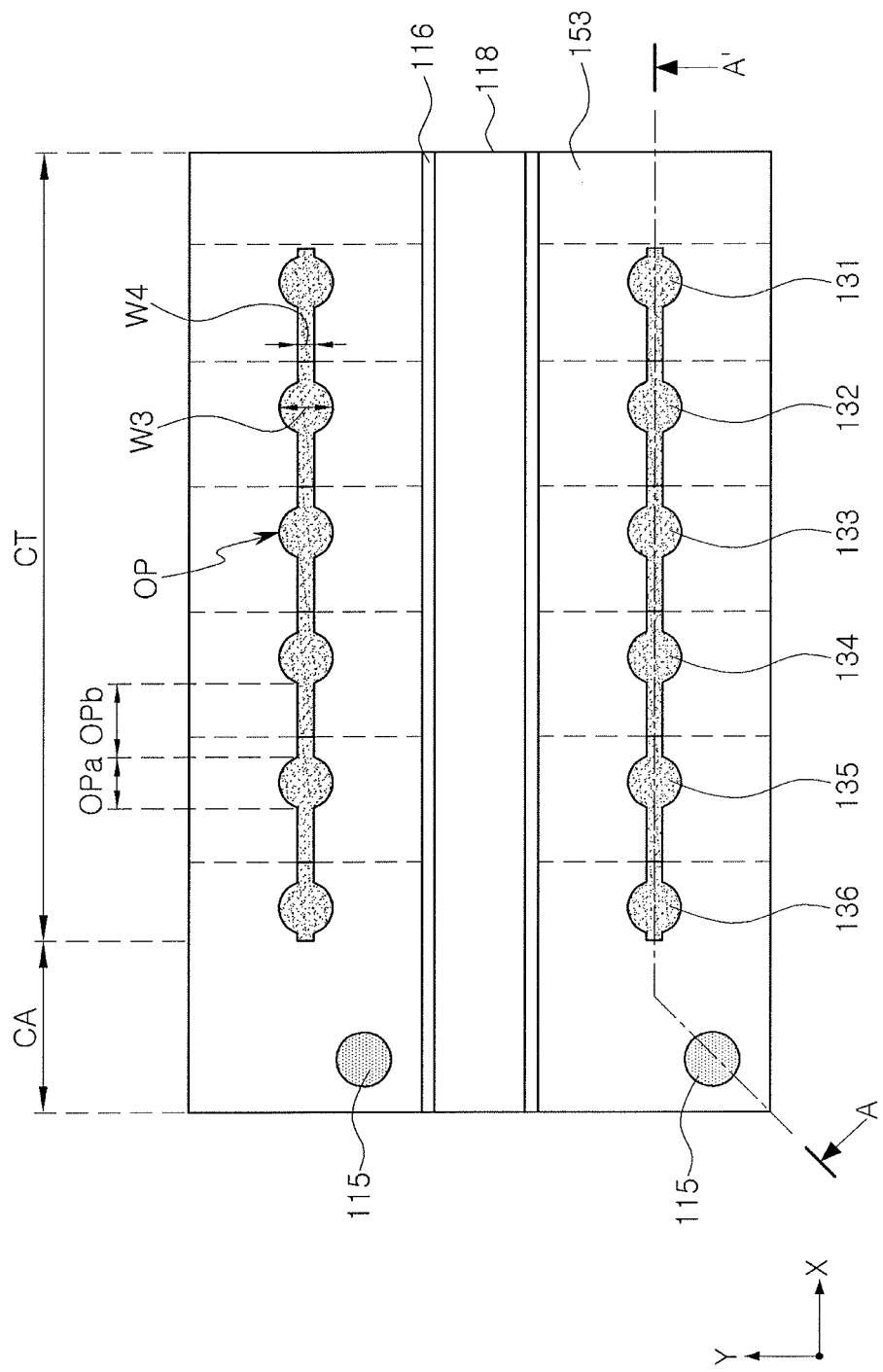
Figure 5K:
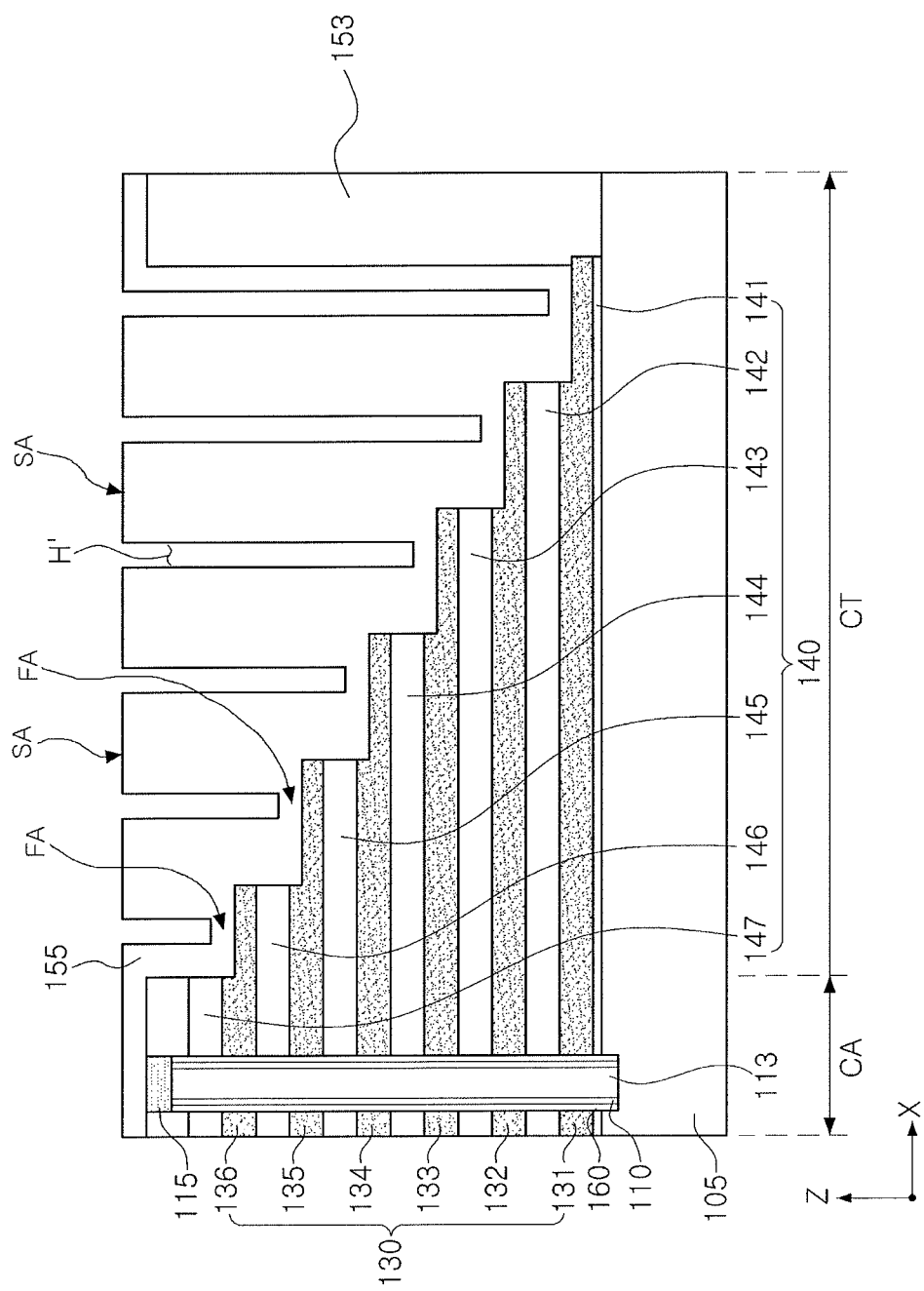
Figure 5L:
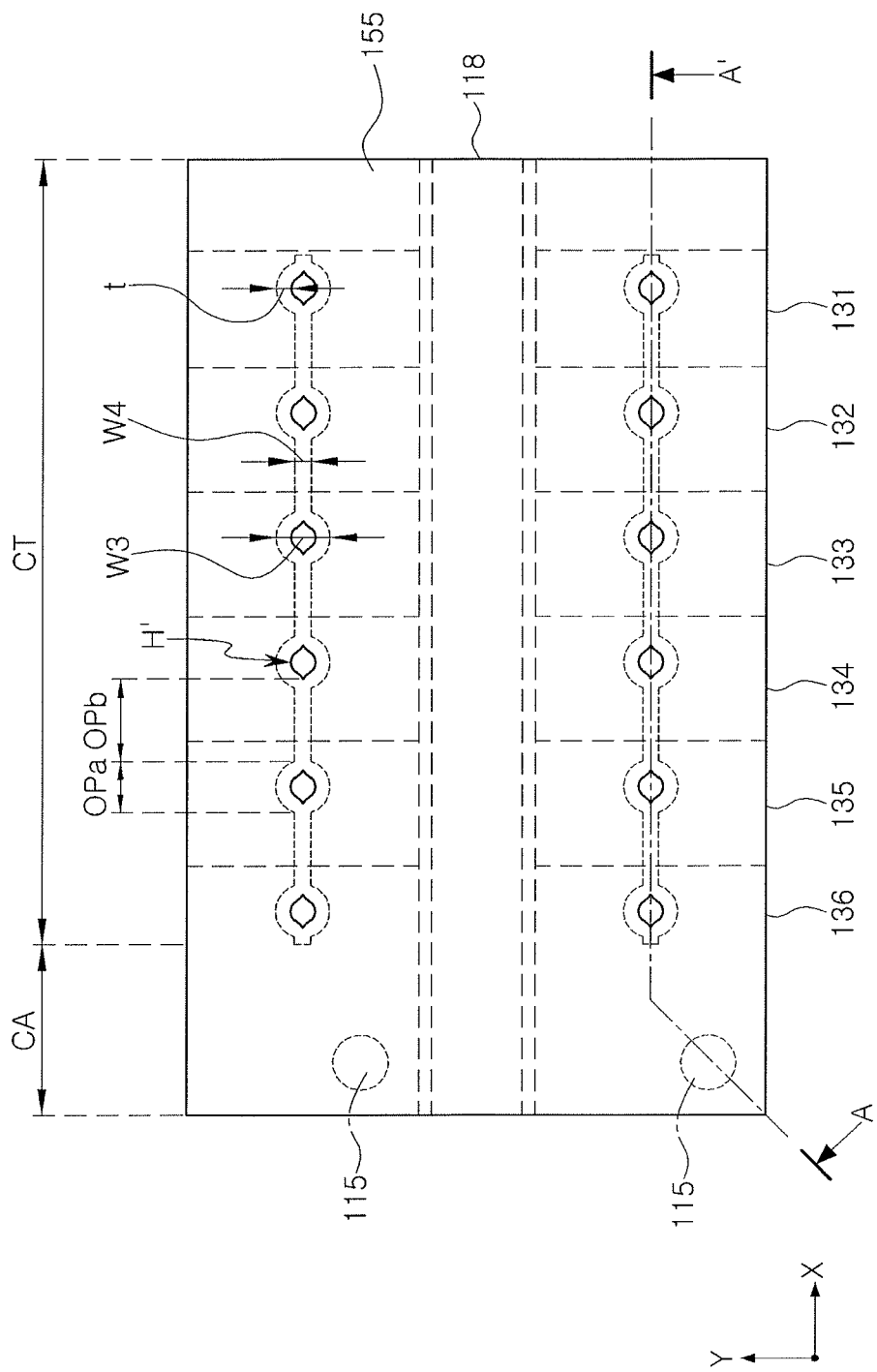
Figure 5M:
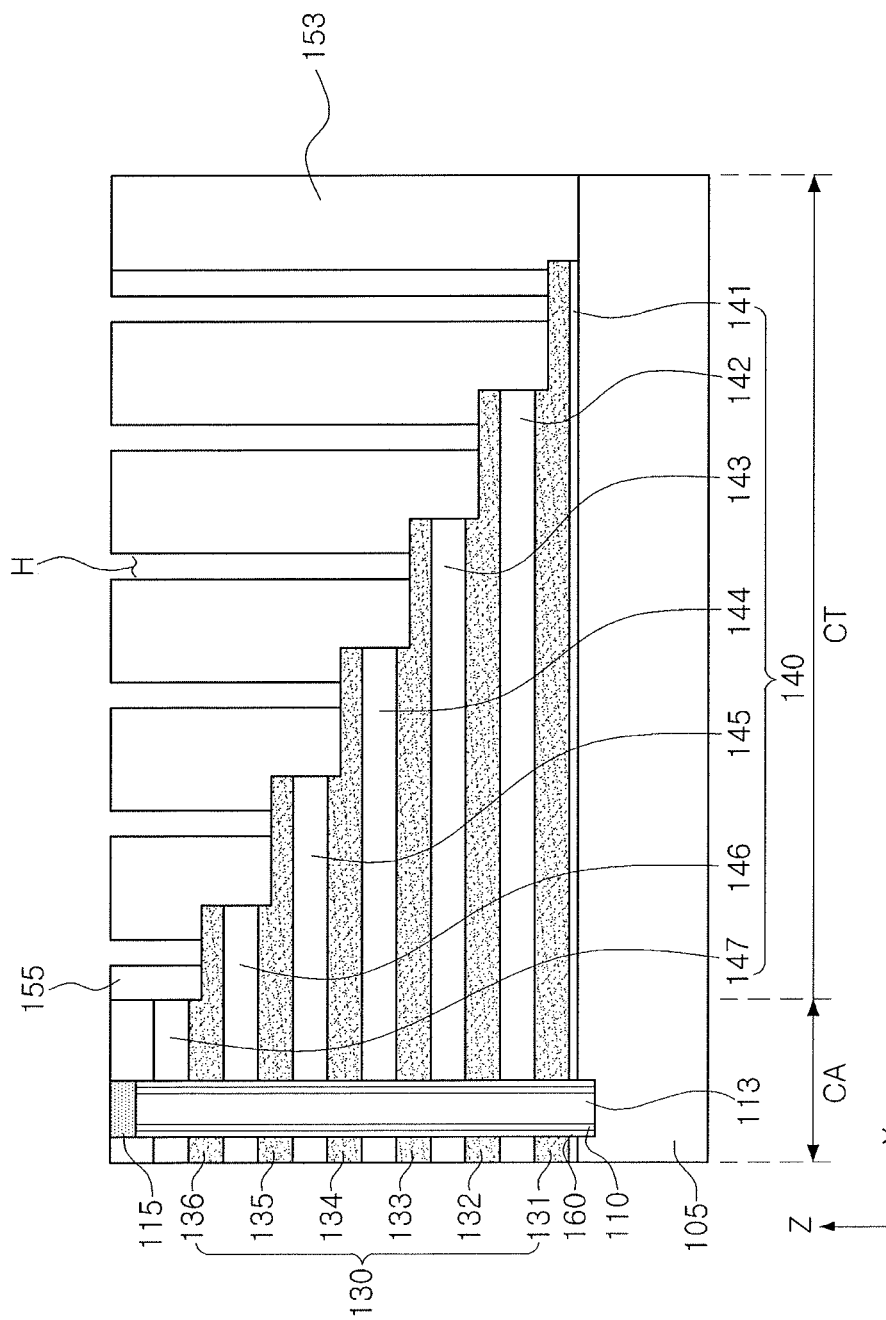
Figure 5N:
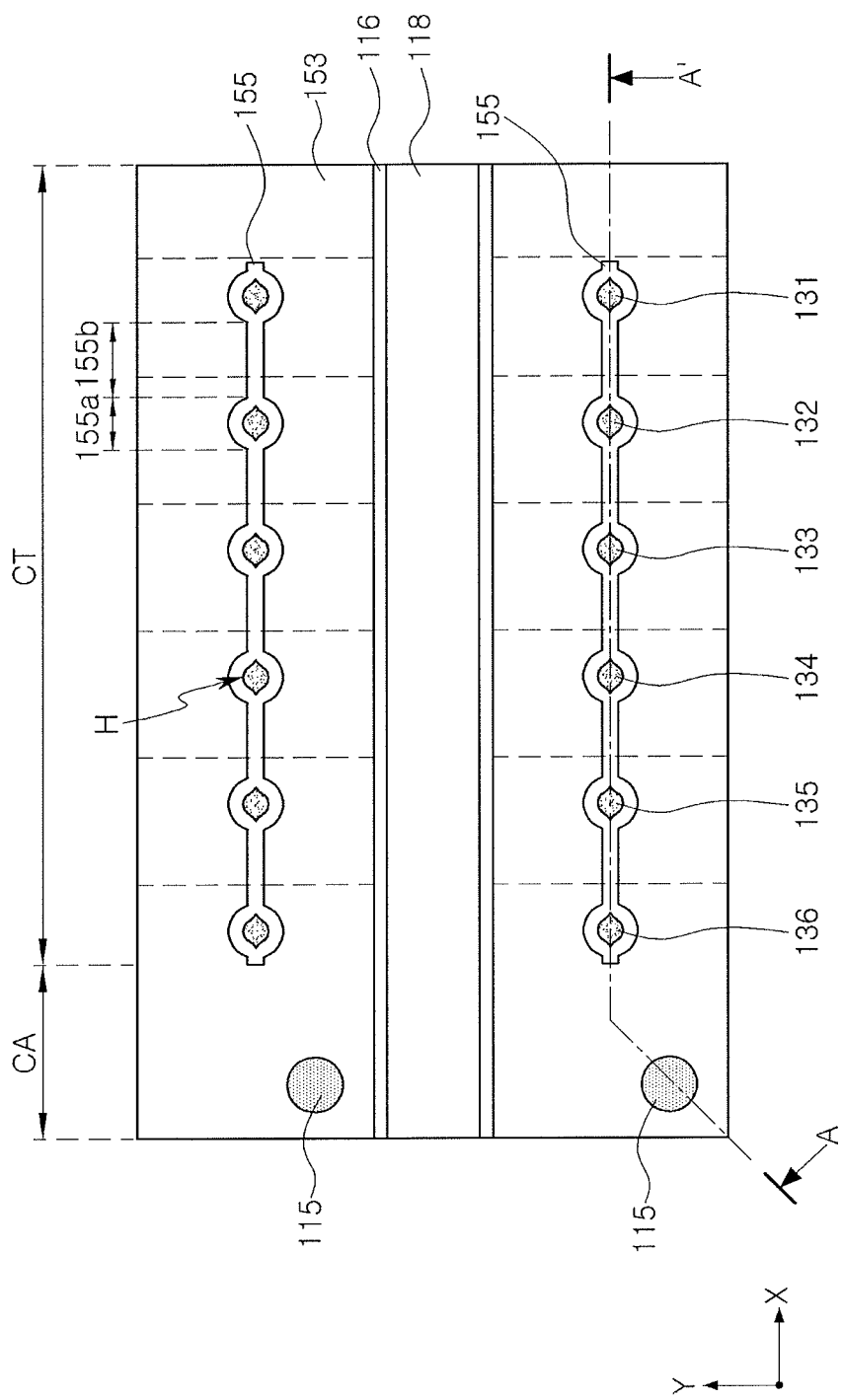
Figure 50:
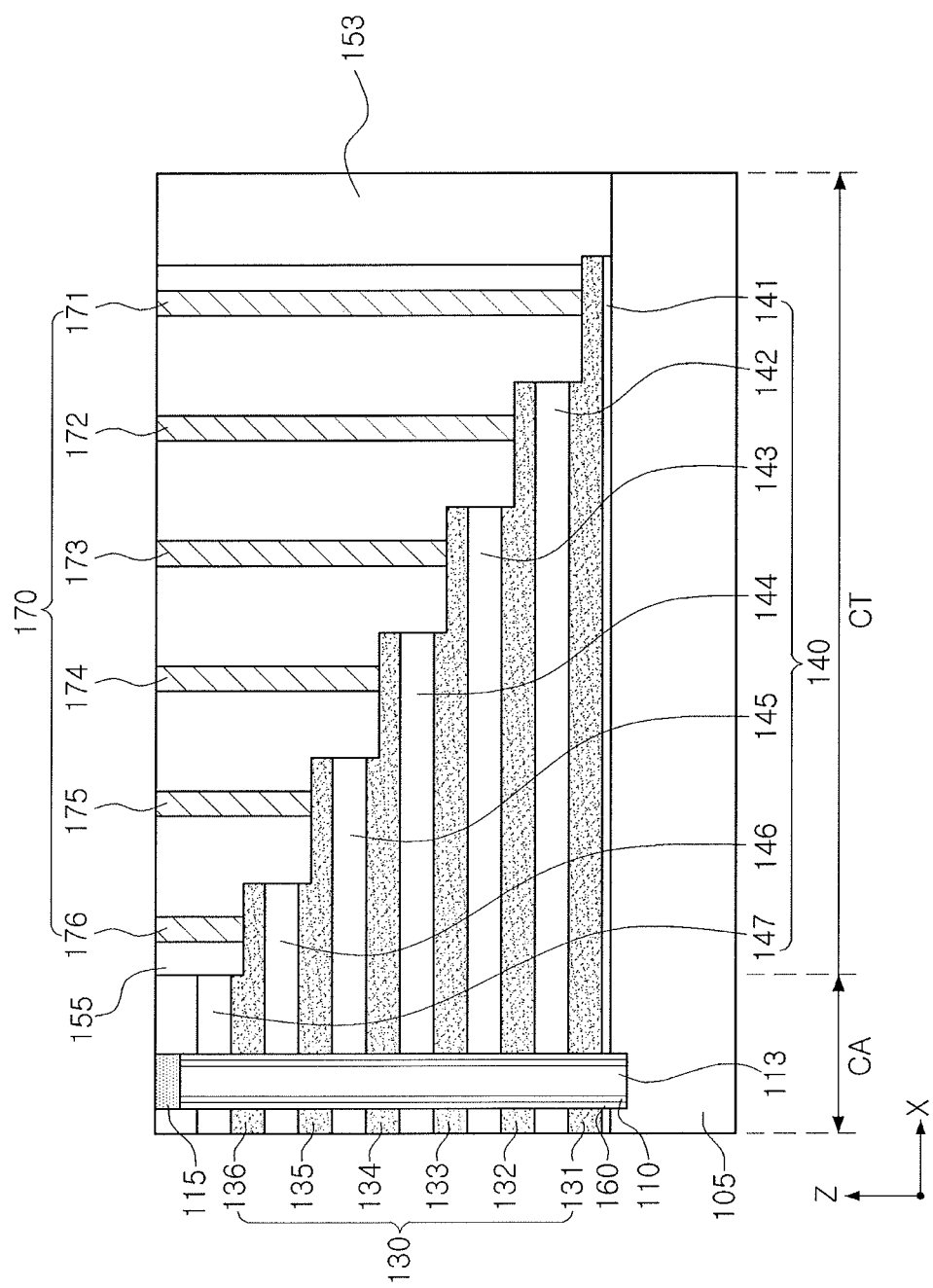
Figure 5P:
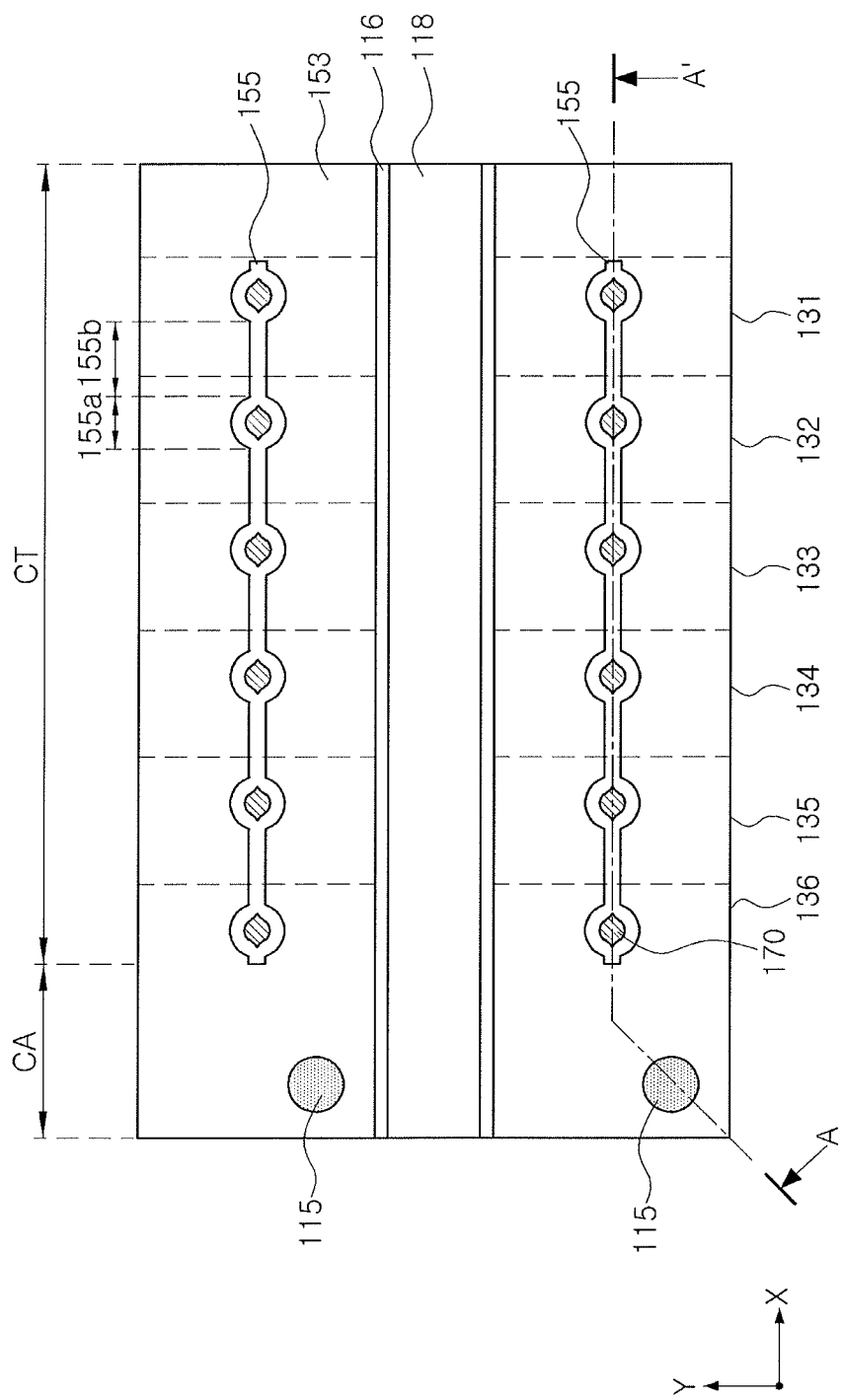

FIGS. 5A to 5P illustrate different stages of an embodiment of a method for manufacturing a memory device, for example, as illustrated in FIG. 4. Referring to FIG. 5A, a plurality of insulating layers 141 to 147 (140) and a plurality of sacrificial layers 121 to 126 (120) are alternately stacked on the substrate 105. The sacrificial layers 120 may include a material that may be etched with etch selectivity with respect to the insulating layers 140. For example, the sacrificial layers 120 may include a material that may be etched, while minimizing etching of the insulating layers 140 during a process of etching the sacrificial layers 120. The etch selectivity may be expressed quantitatively through a ratio of an etch rate of the sacrificial layers 120 to an etch rate of the insulating layers 140.

For example, the insulating layers 140 may include at least one of a silicon oxide or a silicon nitride. The sacrificial layers 120 may include a material different from the insulating layers 140, e.g., a silicon film, a silicon oxide film, a silicon carbide film, or a silicon nitride film. When each of the insulating layers 140 include a silicon oxide film, each of the sacrificial layers 120 may include a silicon nitride film.

According to various example embodiments, thicknesses of the insulating layers 140 may be different. For example, the insulating layer 141 in the lowermost portion in the z-axis direction among the insulating layers 140 may have a smaller thickness relative to the other insulating layers 142 to 147. The insulating layer 147 in the uppermost portion may be relatively thick compared with other insulating layers 141 to 146. In another embodiment, the thicknesses of the insulating layers 140 and the sacrificial layers 120 may be different from those in FIG. 5A. Also, the number of films forming the insulating layers 140 and the sacrificial layers may be different in another embodiment.

Referring to FIG. 5B, the sacrificial layers and the insulating layers 140 that are alternately stacked on the substrate 105 may be etched to provide pad regions having a step structure. In order to form the steps between the sacrificial layers 120 and the insulating layers 140 adjacent in the z-axis direction, a predetermined mask layer may be formed on the sacrificial layers 120 and the insulating layers 140 alternately stacked on the substrate 105. The sacrificial layers 120 and the insulating layers 140 exposed by the mask layer may be etched. By etching the sacrificial layers 120 and the insulating layers 140 exposed by the mask layer and trimming the mask layer a plurality of times, the sacrificial layers 120 and the insulating layers 140 may be sequentially etched to form a step structure having a plurality of steps as illustrated in FIG. 5B.

In an example embodiment, the insulating layers 140 and the sacrificial layers 120 are paired. The insulating layers 140 and the sacrificial layers 120 in each of a plurality of pairs may extend to have the same length in one direction (x-axis direction). An insulating layer 141 may be disposed below the sacrificial layer 121 in the lowermost portion and extend to have the same length as the sacrificial layer 121 in the z-axis direction.

Referring to FIG. 5C, an interlayer insulating layer 153 may be formed to cover the step structure. The interlayer insulating layer 153 may be on the insulating layers 140 and the sacrificial layers 120 forming the step structure in the cell array region CA and the connection region CT.

In order to effectively form the interlayer insulating layer 153, a film, for example, including tetraethylorthosilicate (TEOS) oxide may be used. Forming the interlayer insulating layer 153 as or to include a TEOS oxide film allows for excellent deposition speed and thus may shorten the process time for forming the interlayer insulating layer 153. Forming the interlayer insulating layer 153 as or to include a TEOS oxide may also increase the efficiency of the overall process. In order to form the interlayer insulating layer 153 as or to include a TEOS oxide film having excellent deposition speed but poor gap-filling characteristics, a lower interlayer insulating layer including an HDP oxide film, for example, may be formed before formation of the interlayer insulating layer 153.

Thereafter, a channel region 110 may be formed in the cell array region CA. In order to form the channel region 110, an opening penetrating through the insulating layers 140 and the sacrificial layers 120 in the z-axis direction may be formed. A plurality of openings may be provided according to the number of channel regions 110. The openings may be arranged in a predetermined (e.g., zigzag) pattern on the x-y plane perpendicular to the z-axis and spaced apart from one another and isolated on the x-y plane. The openings may be formed by exposing only regions in which the openings are to be formed using a mask layer, and anisotropic-etching the exposed regions. Each of the openings may expose an upper surface of the substrate 105 or may form a recess in the upper surface of the substrate 105.

A gate insulating layer 160 including a blocking layer, an electrical charge storage layer, and a tunneling layer may be formed on an inner surface and a lower surface of each of the openings through atomic layer deposition (ALD). The blocking layers, the electrical charge storage layer, and the tunneling layer may be sequentially stacked from a region close to the sacrificial layers 120 and the insulating layers 140.

A channel region 110 may be formed on an inner surface of the gate insulating layer 160. The channel region 110 may have a predetermined thickness, for example, a thickness ranging from 1/50 to 1/5 of a width of each of the openings. The channel region 110 may be formed of polycrystalline silicon or single crystal silicon. The channel region 110 may be formed through ALD or chemical vapor deposition (CVD). In a lower surface of each of the openings, the channel region 110 is in direct contact with the substrate 105 and electrically connected thereto.

The interior of the channel region 110 may be filled with an embedded insulating layer 113. Before formation of the embedded insulating layer 113, hydrogen annealing may be selectively performed to heat-treat the structure in which the channel region 110 is formed under a gas atmosphere including hydrogen or heavy hydrogen (e.g., deuterium). Through hydrogen annealing, large portions of crystal defects present within the channel region 110 may be cured.

The structure may follow the example embodiment in FIG. 4, but the channel region 110 may be formed to have a different structure in a another embodiment. For example, after a plurality of openings for forming the channel region 110 are prepared, the channel region 110 may be immediately formed without a process of forming the gate insulating layer 160, and the embedded insulating layer 113 may be formed within the channel region 110. The gate insulating layer 160 may be formed before the process of forming the gate electrode layer 130 and disposed in such a manner to surround the gate electrode layer 130.

Thereafter, a planarization process may be performed to remove an unnecessary semiconductor material and an insulating material covering the interlayer insulating layer 153. Thereafter, an upper portion of the embedded insulating layer 113 may be partially removed using an etching method, or the like, to form a conductive material that forms a conductive layer 115 on the embedded insulating layer 113 and the interlayer insulating layer 153. A planarization process may be performed again to form the conductive layer 115 connected to the channel region 110.

Thereafter, referring to FIG. 5D, the sacrificial layers may be removed to form side openings Th. As the sacrificial layers 120 are selectively removed through wet etching, a plurality of side openings Th may be prepared between the insulating layers 140. Portions of the gate insulating layer 160 may be exposed through side openings Th.

Thereafter, referring to FIG. 5E, gate electrode layers 131 to 136 (130) may be formed within the side openings Th. The gate electrode layers 131 to 136 (130) may be formed by depositing a conductive material within the side openings Th. The gate electrode layers 1300 may be formed of a conductive material, e.g., tungsten (W) or another metal or allow. The gate electrode layers 130 may be formed, for example, through an ALD or CVD process.

Thus, the gate electrode layers 130 extend to have different lengths in a first direction (e.g., x-axis direction) to thereby provide a step structure. An interlayer insulating layer 153 may be disposed on the gate electrode layers 130 forming the step structure. Insulating layers 1400 may be disposed between the gate electrode layers 130.

Thereafter, referring to FIGS. 5F and 5G, a mask pattern 210 may be formed to expose portions of the interlayer insulating layer 153 in the connection region CT. FIG. 5G is a plan view from above the substrate 105, and FIG. 5F is a cross-sectional view taken along line A-A' in FIG. 5G.

The mask pattern 210 includes first pattern regions 210a and second pattern regions 210b. The first pattern regions 210a correspond to positions of contact holes formed through a follow-up process. The second pattern regions 210b connect the first pattern regions 210a and extend in the first direction (e.g., x-axis direction). The interlayer insulating layer 153 may be exposed through the first and second pattern regions 210a and 2110b of the mask pattern 210. The first pattern regions 210a may correspond to the number of the contact holes and may be disposed in a row in the first direction.

The second pattern regions 210b may have a predetermined width W2 and have a linear shape extending in the first direction. The width W1 of the first pattern region 210a may be greater than the width W2 of the second pattern region 210b. The width W1 of the first pattern region 210a may be appropriately determined in consideration of the width W2 of the second pattern region 210b and a size of the contact holes. For example, the width W1 of the first pattern region 210a may be equal to or greater than the sum of the width W2 of the second pattern region 210b and the size of the contact holes.

The first pattern regions 210a is illustrated as having a circular shape. The shape of the first pattern regions 210a may be different in another embodiment. Also, the second pattern region 210b may have a different predetermined width in another embodiment.

Thereafter, referring to FIGS. 5H, 5I, and 5J, in the connection region CT, an opening OP exposing the gate electrode layers 130 may be formed within the interlayer insulating layer 153. FIG. 5J is a plan view from above the substrate 105. FIG. 5H is a cross-sectional view of FIG. 5J taken along line A-A'. FIG. 5I is an enlarged view of a region A of FIG. 5H.

The opening OP having a linear shape extending in the first direction exposing the gate electrode layers 131 to 136 (130) may be formed by removing portions of the interlayer insulating layer 153 and the insulating layer 140 using the mask pattern 210 in FIGS. 5F and 5G as an etch mask. The mask pattern 210 may be removed after the opening OP is formed.

The opening OP may include first opening regions OPa disposed in a row in the first direction (e.g., x-axis direction) and formed to correspond to the number of contact holes and second opening regions OPb connecting the first opening regions OPa to each other. When viewed from above the substrate 105, the first opening regions OPa of the openings OP may have a shape corresponding to the first pattern regions 210a of the mask pattern 210. The second opening regions OPb may have a shape corresponding to the second pattern regions 210b of the mask pattern 210.

The second opening region OPb may have a predetermined width W4 and a linear shape extending in the first direction. The width W3 of the first opening region OPa may be greater than the width W4 of the second opening region OPb.

During an etching process of simultaneously forming a plurality of contact holes with different depths, the other gate electrode layers 132 to 136 should not be penetrated through by the etching process for each contact hole until the interlayer insulating layer 153 and the insulating layer 140 are etched. This will form contact holes reaching the gate electrode layer 131 positioned in the lowermost portion in the z-axis direction.

Thus, during the process of etching the interlayer insulating layer 153 and the insulating layer 140, if an etch selectivity regarding the gate electrode layers 130 is not appropriately secured, some of the gate electrode layers 130 at an upper or middle portion may be penetrated through in the z-axis direction. This may cause a bridge defect in which some gate electrode layers 130 are electrically connected to each other after embedding of a conductive material.

In the present example embodiment, the openings OP include the first opening regions OPa and the second opening regions OPb. Contact holes are disposed in first opening regions OPa. The second opening regions OPb connect the first opening regions OPa and have a linear shape extending in the first direction (e.g., x-axis direction). While the interlayer insulating layer 153 and the insulating layer 140 are etched using an etchant gas including a mixture of a fluorocarbon-based gas, argon, and oxygen, a fluorocarbon ($C_xF_y$) polymer, a passivation material, may be formed to be uniform in thickness in the entire region of the openings OP. Thus, appropriate etch selectivity regarding the gate electrode layers 130 may be uniformly secured in the entire region of the openings OP. As a result, a phenomenon in which a portion of the gate electrode layers 130 is penetrated through during an etching process of the opening OP may be prevented.

Referring to FIG. 5I, while the opening OP is formed, recesses R corresponding to the shape of the opening OP may be formed on upper portions of the gate electrode layers 131 to 136 (300). Since etch selectivity with respect to the gate electrode layers 130 is substantially uniformly secured in the entire region of the openings OP, depths of the recesses R on the gate electrode layers 131 to 136 (130) may be substantially equal.

Thereafter, referring to FIGS. 5K and 5L, a plurality of preliminary contact holes H' for forming contact plugs (170 of FIG. 4) may be formed. FIG. 5K is a cross-sectional view taken along line A-A' in FIG. 5L, and FIG. 5L is a plan view from above the substrate 105.

First, the fluorocarbon ($C_xF_y$) polymer formed within the openings OP may be removed. Next, the openings OP may be filled with a contact insulating layer 155 to form the preliminary contact holes H'. For example, the contact insulating layer 155 may be formed on the side walls of the openings OP in such a manner that the first opening regions OPa are partially filled and the second opening regions OPb are entirely filled. As a result, the preliminary contact holes H' may be formed.

The contact insulating layer 155 may also be formed on the gate electrode layers 130 exposed through the openings OP, on the conductive layer 118, and on the interlayer insulating layer 153. The contact insulating layer 155 may be formed to have a uniform thickness through ALD. The thickness t of the contact insulating layer 155 with respect to the side wall of the opening OP may be greater than a half the width W4 of the second opening region OPb and less than a half the width W3 of the first opening region OPa. The contact insulating layer 155 may be formed a material having insulation properties to electrically insulate the contact plugs. In an example embodiment, the contact insulating layer 155 may be formed of an insulating material different from the interlayer insulating layer 153.

Thereafter, referring to FIGS. 5M and 5N, a plurality of contact holes H for forming the contact plugs (170 of FIG. 4) may be formed. FIG. 5M is a cross-sectional view taken along line A-A' in FIG. 5N and FIG. 5N is a plan view from above the substrate 105.

The contact insulating layer 155 in lower portions of the preliminary contact holes H' are removed to expose the gate electrode layers 131 to 136 (130) in the first opening regions OPa (e.g., refer to FIG. 5M), thereby forming contact holes H. The contact insulating layer 155 in lower portions of the preliminary contact holes H' may be removed, for example, through etch back or wet etching. The contact insulating layer 155 on the conductive layer 118 and the interlayer insulating layer 153 may also be removed together.

Thereafter, referring to FIGS. 5O and 5P, contact plugs 171 to 176 (170) connected to the gate electrode layers 131 to 136 (130) may be formed. FIG. 5O is a cross-sectional view taken along line A-A' in FIG. 5P and FIG. 5P is a plan view from above the substrate 105.

After the conductive material is formed to fill the contact holes H exposing the gate electrode layers 130, a planarization process may be performed to expose the interlayer insulating layer 153 is exposed, thereby forming the contact plugs 170. The contact plugs 170 may include a conductive material, for example, tungsten (W).

Figure 6:
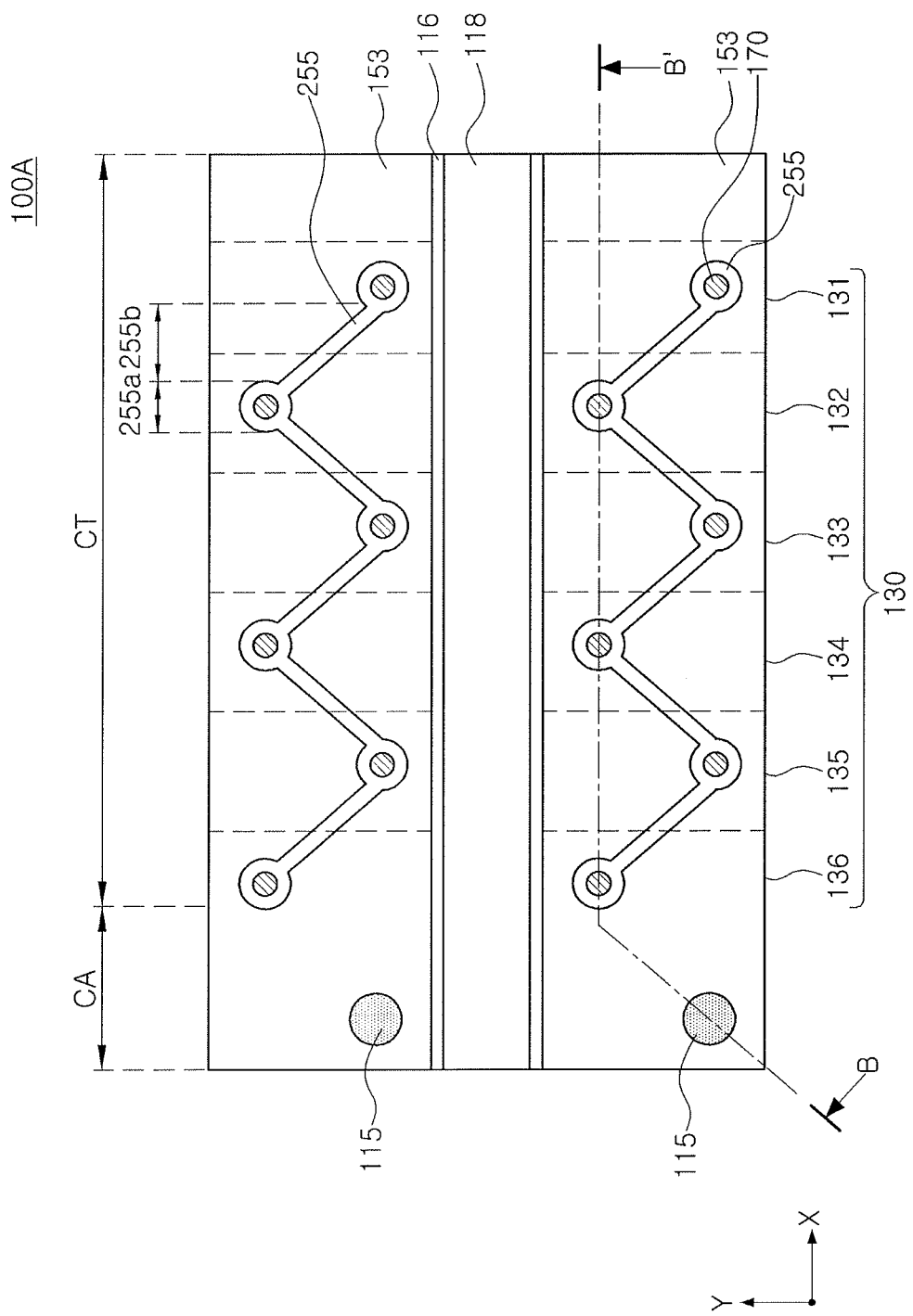
FIG. 6 illustrates a plan view of another embodiment of a memory device.
Figure 7:
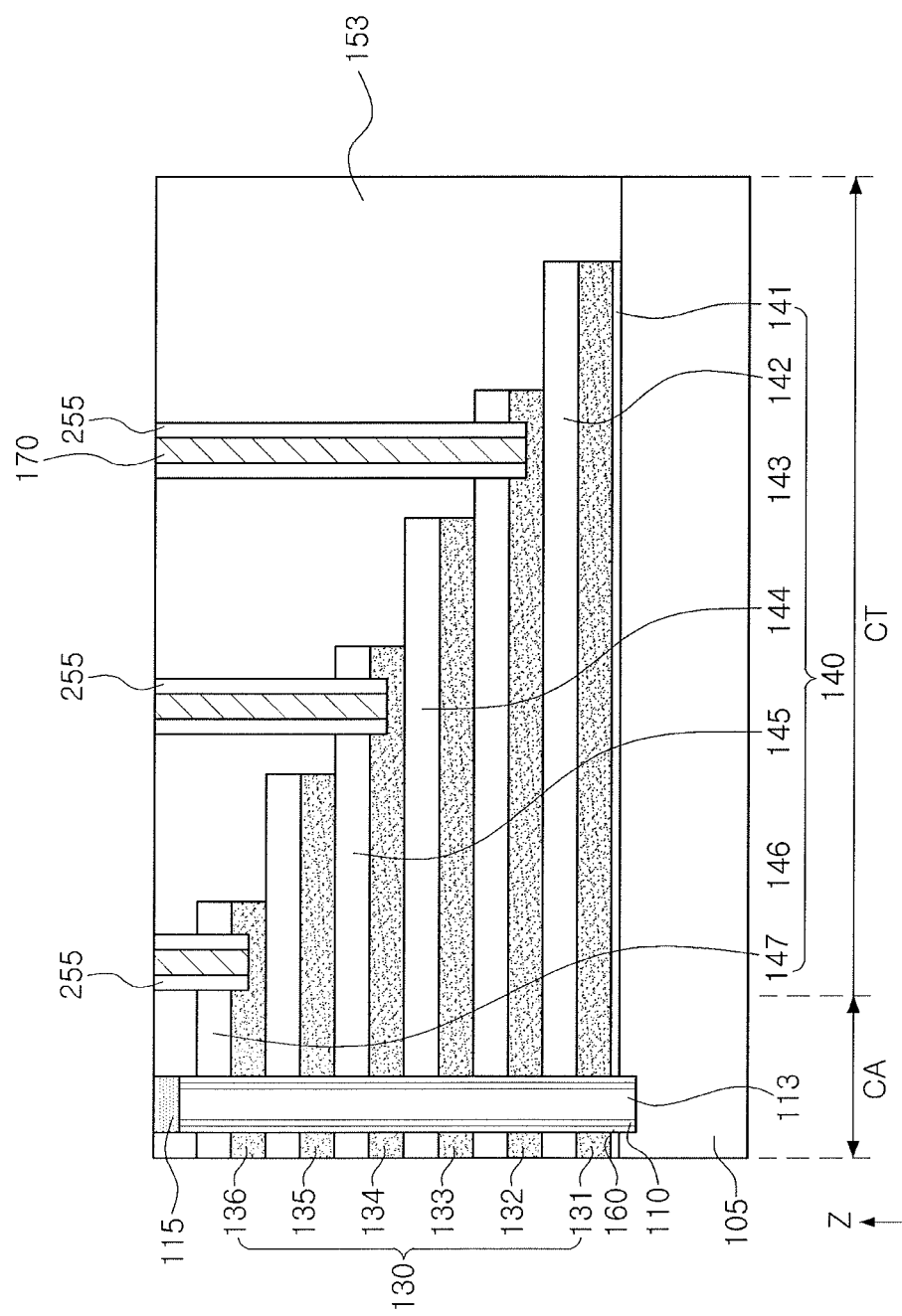
FIG. 7 illustrates a cross-sectional view of the memory device in FIG. 6.

FIGS. 6 and 7 are respective plan and cross-sectional views of another embodiment of a memory device 100A. FIG. 6 is a plan view from above the substrate 105, and FIG. 7 is a cross-sectional view taken along line C-C' in FIG. 6.

Referring to FIGS. 6 and 7, unlike memory device 100, memory device 100A may include contact plugs 170 arranged in a zigzag pattern in the first direction (e.g., x-axis direction) on the gate electrode layers 130 in the connection region CT. In order to electrically insulate the contact plugs 170 from each other in the connection region CT, contact insulating layers 255 may be formed to surround the contact plugs 170 and to extend in the x-axis direction and the z-axis direction.

Each of the contact insulating layers 255 may include first regions 255a surrounding outer circumferential surfaces of the contact plugs 170 and second regions 255b connecting the first regions 255a. The first regions 255a may be arranged in a zigzag pattern in the first direction. The contact insulating layers 255 may extend in the z-axis direction along the contact plugs 170 so as to be in contact with the gate electrode layers 130. The contact insulating layers 255 may be in contact with the gate electrode layers 130 through the insulating layers 140. The contact insulating layers 255 may be formed of a material different from the interlayer insulating layer 153. Recesses having the same shape as that of the outer circumferential surface of the contact insulating layer 255 may be formed on upper portions of the gate electrode layers 130 in contact with the contact insulating layers 255. Depths of the recesses may be substantially the same.

Figure 8:
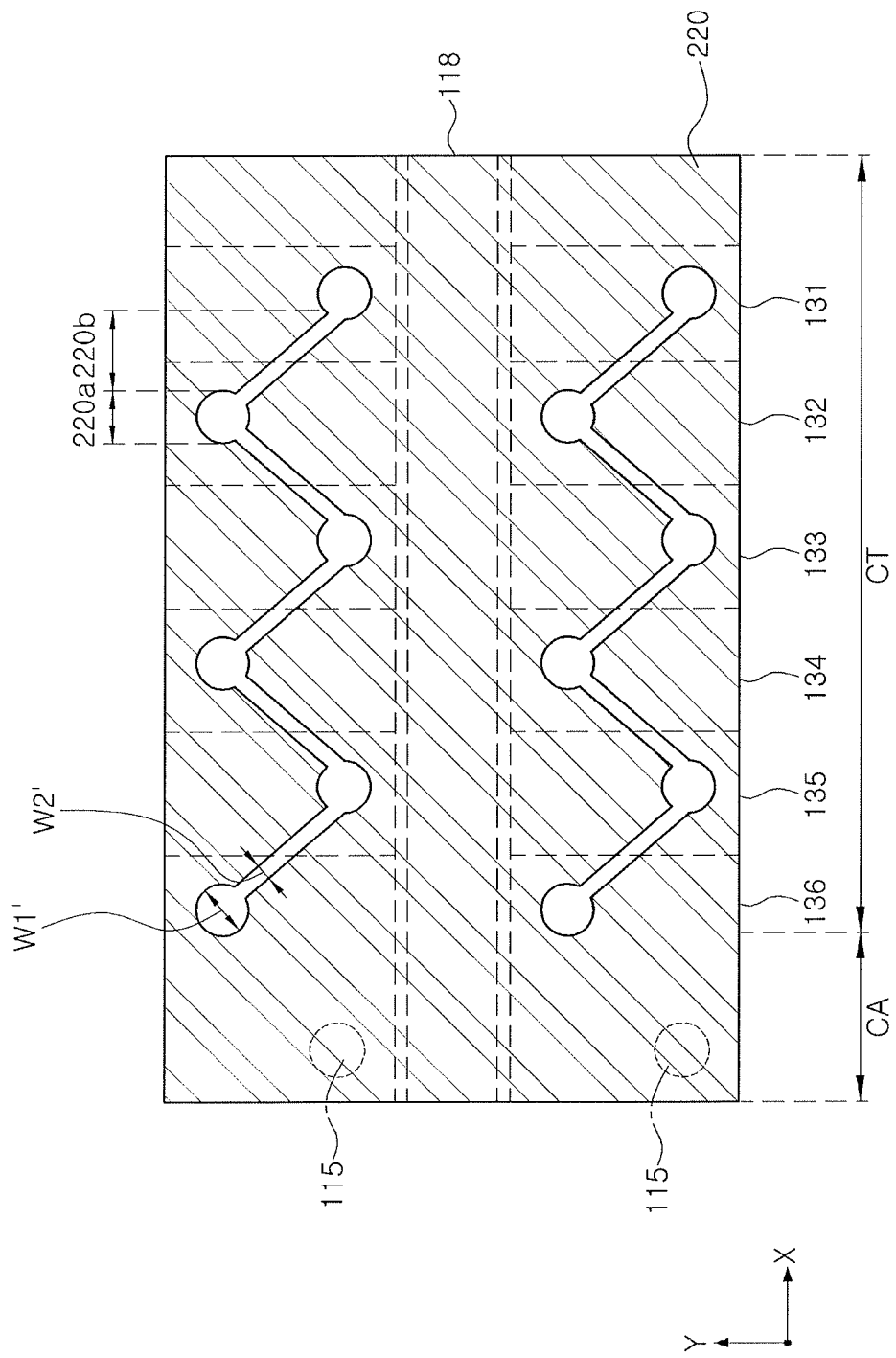
FIG. 8 illustrates another embodiment of a method for manufacturing a memory device.

FIG. 8 illustrates an embodiment of a method for manufacturing the memory device 100A in FIGS. 6 and 7. FIG. 8 illustrates a modified form of the mask pattern in FIG. 5G.

Referring to FIG. 8, a mask pattern 220 may include first pattern regions 220a and second pattern regions 220b. The first pattern regions 220a are disposed to correspond to positions of contact holes to be formed through a follow-up process. The second pattern regions 220b connect the first pattern regions 220a to each other and may extend in the first direction (e.g., x-axis direction). The first pattern regions 220a may be formed to correspond to the number of the contact holes and may be disposed in a zigzag pattern in the first direction.

The second pattern regions 220b may have a predetermined width W2' and a linear shape extending in a slant with respect to the first direction. The width W1' of the first pattern region 220a may be greater than the width W2' of the second pattern region 220b. The width W1' of the first pattern region 220a may be determined, for example, based on the width W2' of the second pattern region 220b and the size of the contact holes. For example, the width W1' of the first pattern region 220a may be equal to or greater than the sum of the width W2' of the second pattern region 220b and the size of the contact holes.

The first pattern regions 220a are illustrated to have a circular shape. In another embodiment, the first pattern regions 220a may have a different shape. Also, the second pattern region 220b may have a different predetermined width as that illustrated.

Thereafter, the process described above with reference to FIGS. 5H to 5J may be performed to form first opening regions OPa, arranged in a zigzag pattern in the first direction corresponding to the number of the contact plugs, and second opening regions OPb connecting the first opening regions OPa to each other. Subsequently, the process described above with reference to FIGS. 5K through 5P may be performed to form the contact plugs 170 connected to the gate electrode layers 130.

Figure 9:
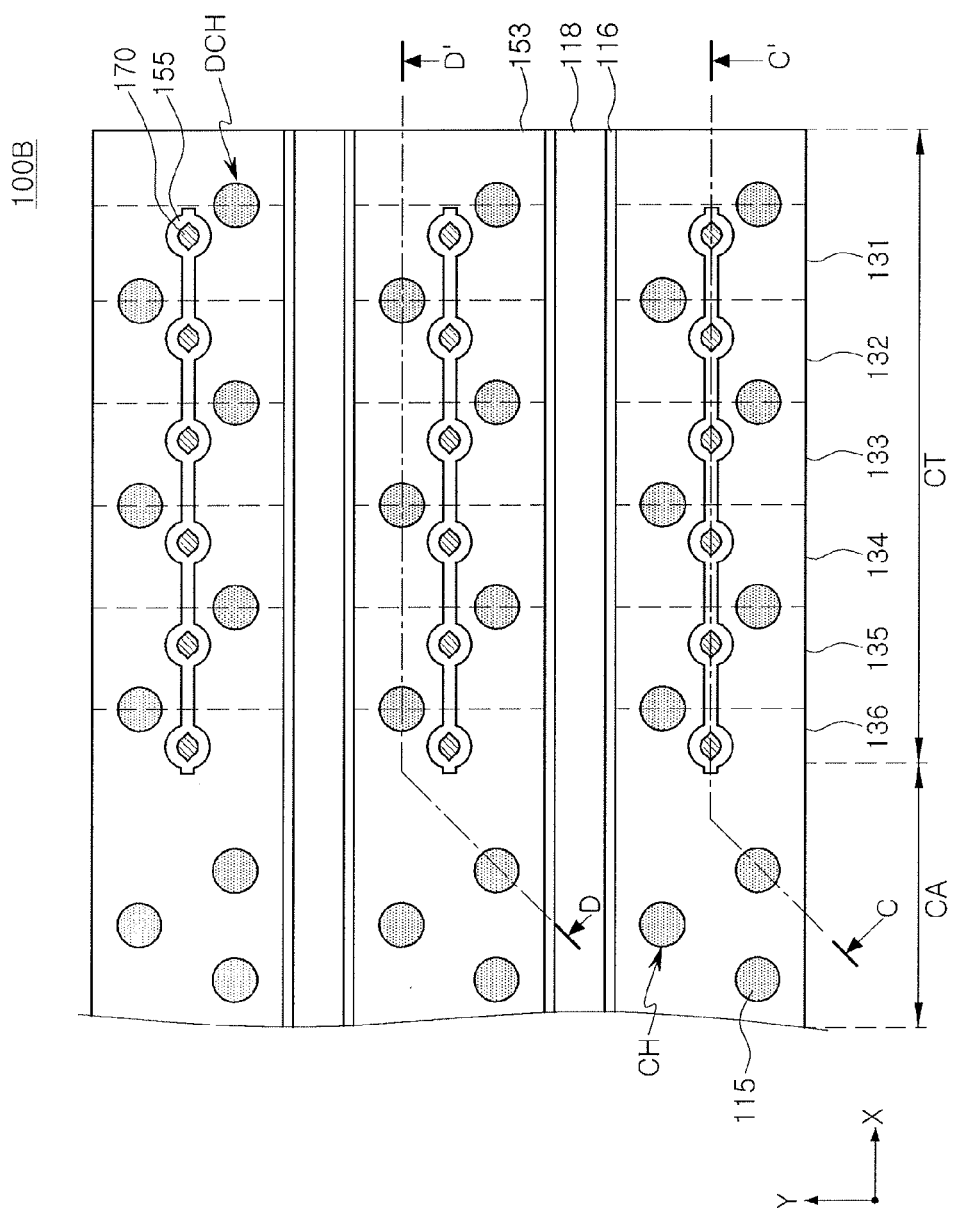
FIGS. 9 to 11 illustrate a plan view and cross-sectional views of another embodiment of a memory device.
Figure 10:
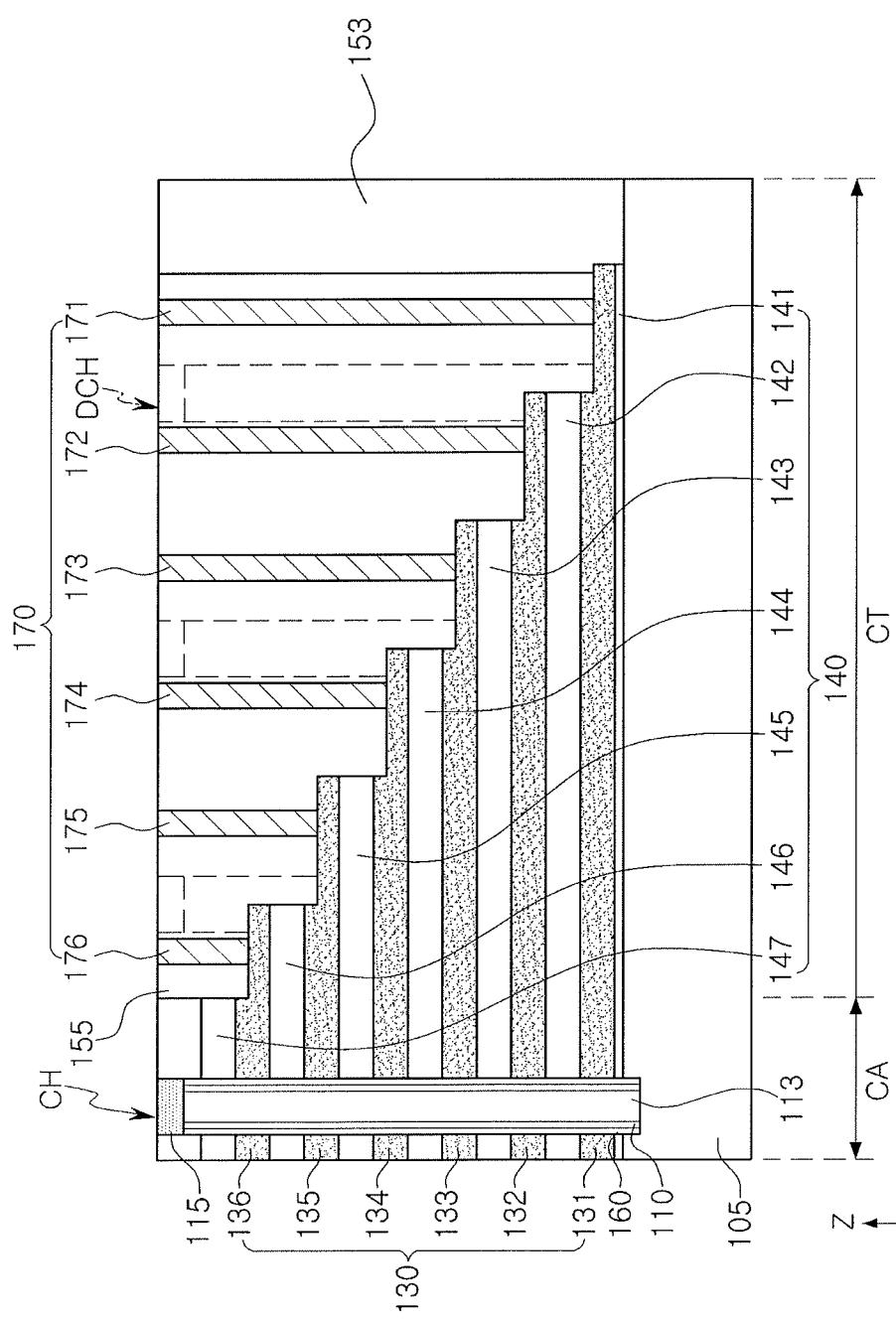
Figure 11:
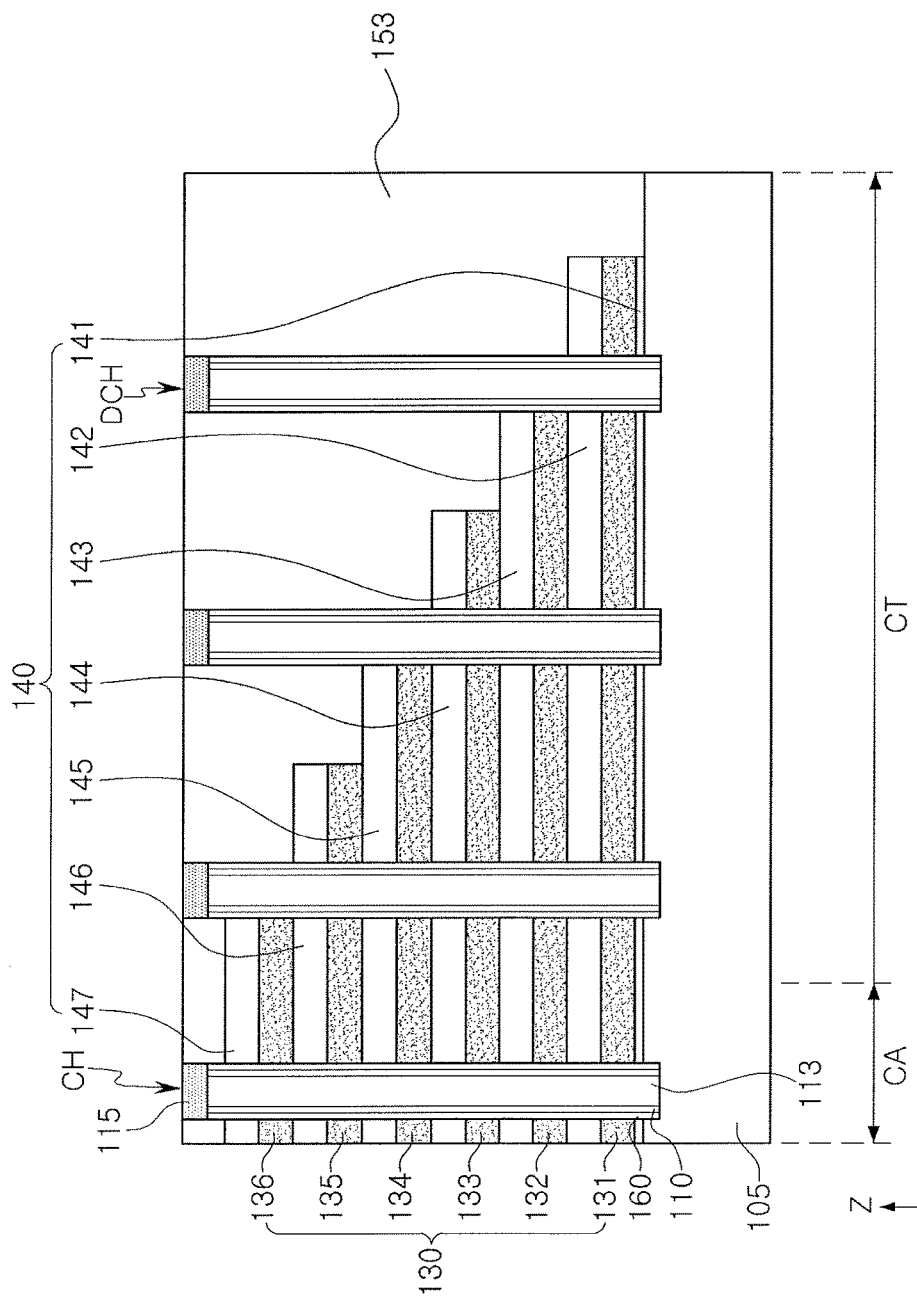

FIGS. 9 to 11 illustrate plan and cross-sectional views of another embodiment of a memory device 100B. FIG. 9 is a plan view from above the substrate 105. FIG. 10 is a cross-sectional view taken along line C-C' in FIG. 9. FIG. 11 is a cross-sectional view taken along line D-D' in FIG. 9.

Referring to FIGS. 9 through 11, unlike memory device 100, memory device 100B may include dummy channel columns DCH arranged in a zigzag pattern in the first direction (e.g., x-axis direction) on the gate electrode layers 130 in the connection region CT. The dummy channel columns DCH may be arranged in a different pattern in another embodiment. The dummy channel columns DCH may be adjacent to one end of the gate electrode layers 130 in the first direction (e.g., x-axis direction). In one embodiment, the dummy channel columns DCH may not contact ends of some of the layers in the gate electrode layer 130.

The dummy channel columns DCH may support the insulating layer 140 during the process of removing the sacrificial layer 120 in the manufacturing process of memory device 100 described above with reference to FIG. 5D. The dummy channel columns DCH may have the same structure as the channel columns CH in the cell array region CA.

Figure 12:
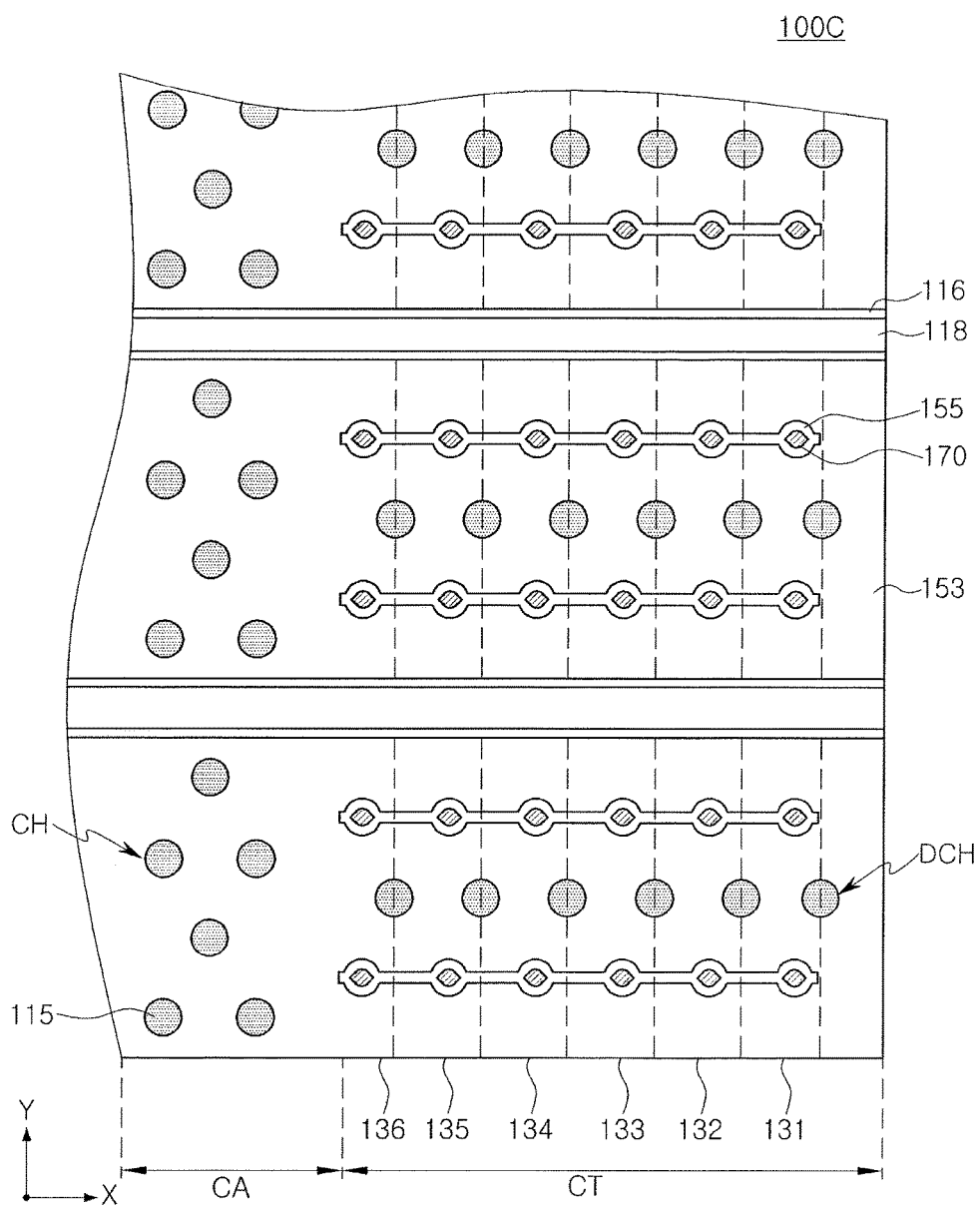
FIGS. 12 and 13 illustrate additional embodiments of a memory device.
Figure 13:
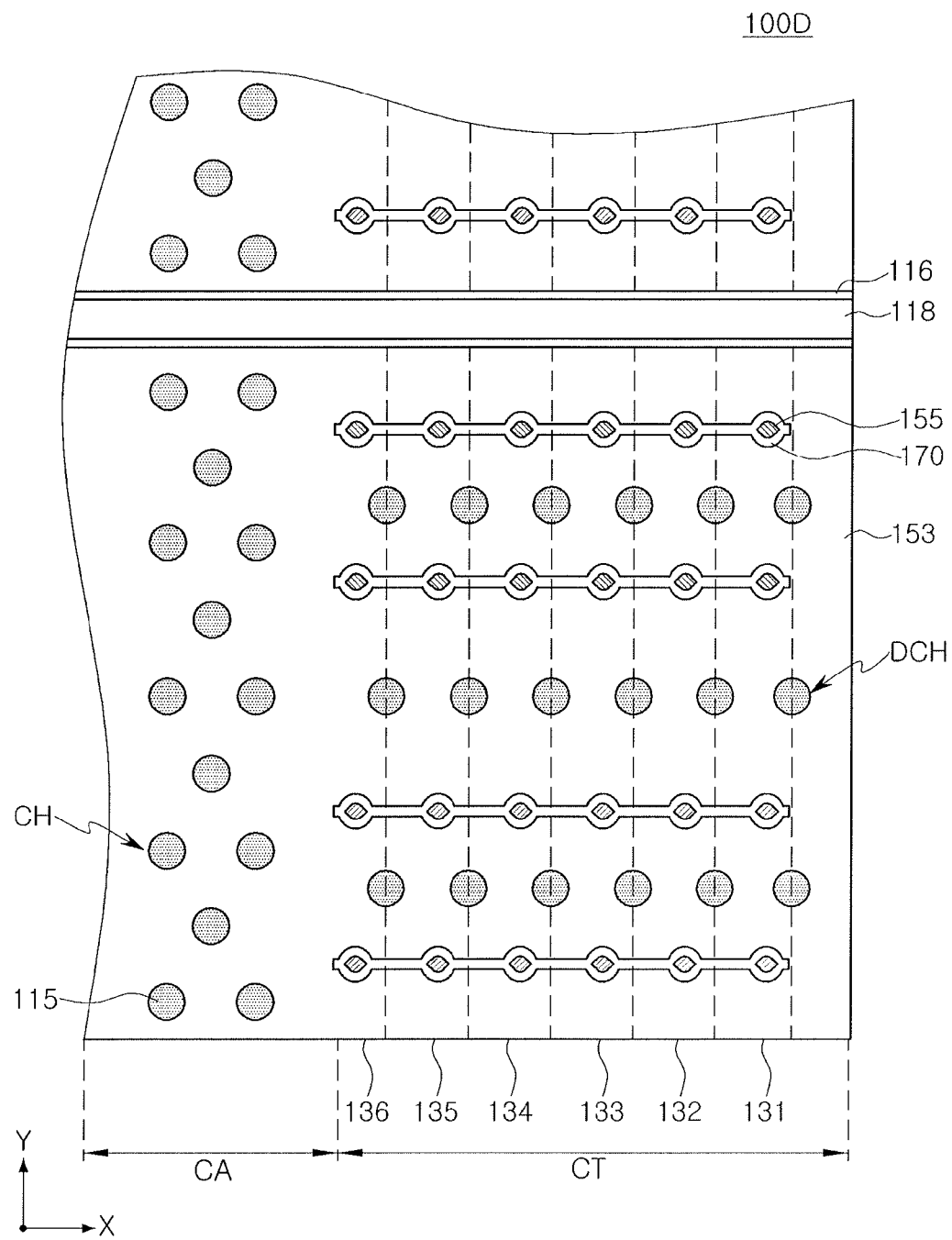

FIGS. 12 and 13 illustrate additional embodiments corresponding to memory devices 100C and 100D. Referring to FIG. 12, unlike the memory device 100B, memory device 100C includes channel columns CH disposed in four rows in the first direction (e.g., x-axis direction) in the cell array region CA in each gate stack divided by the conductive layers 118. Memory device 100C may further include dummy channel columns DCH disposed in a row in the first direction (e.g., x-axis direction) on the gate electrode layers 130 in the connection region CT. The dummy channel columns DCH may be arranged differently in another embodiment. For example, the dummy channel columns DCH may be disposed in three rows in the first direction (e.g., x-axis direction). In another embodiment, the memory device 100C may include contact plugs 170 disposed in two rows in the first direction and two contact insulating layers 155 surrounding the contact plugs 170 in each gate stack. The contact plugs 170 may be arranged in a different manner in another embodiment.

Referring to FIG. 13, unlike the memory device 100B, memory device 100D includes channel columns CH disposed in nine rows in the first direction (e.g., x-axis direction) in the cell array region CA in each gate stack divided by the conductive layers 118. The memory device 100D may further include dummy channel columns DCH disposed in three rows in the first direction (e.g., x-axis direction) on the gate electrode layers 130 in the connection region CT. Also, the memory device 100D may include contact plugs 170 disposed in four rows in the first direction and four contact insulating layers 155 surrounding the contact plugs 170 in each gate stack. The contact plugs 170 and dummy channel columns DCH may be arranged in a different manner in another embodiment.

Figure 14:
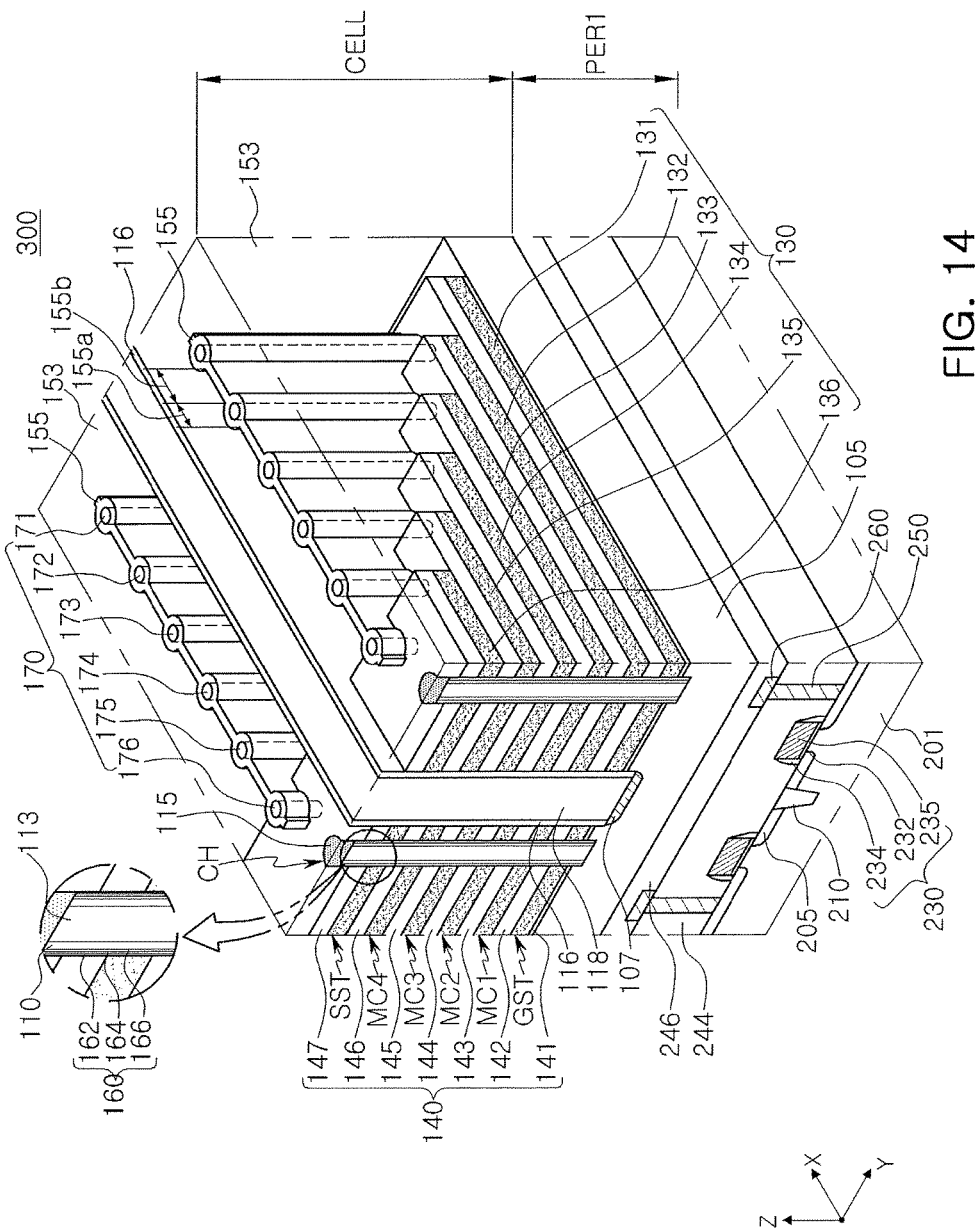
FIG. 14 illustrates another embodiment of a memory device.

FIG. 14 illustrates another embodiment of a memory device 300 which may include a cell region CELL and a peripheral circuit region PERI. The cell region CELL may correspond to a region in which the memory cell array 20 of FIG. 1 is disposed. The peripheral circuit region PERI may correspond to a region in which the driving circuit 30 of the memory cell array 20 is disposed. The cell region CELL may be above the peripheral circuit region PERI. In another example embodiment, the cell region CELL may be below the peripheral circuit region PERI.

The cell region CELL may have the same structure as the example embodiment in FIG. 4. The structure described above with respect to FIG. 4 may be applied as is. However, the substrate 105 may have the same size as a base substrate 201 or may be smaller than the base substrate 201. The substrate 105 may be formed, for example, of polycrystalline silicon or amorphous silicon and subsequently transformed into a single-crystal structure by heat treatment. The cell region CELL may have a different structure in another embodiment.

The peripheral circuit region PERI may include a base substrate 201, and circuit elements 230, contact plugs 250, and wiring lines 260 on the base substrate 201.

The base substrate 201 may have an upper surface extending in the x and y directions. The base substrate 201 may include an isolation layer 210 defining an active region. A doped region 205 including an impurity may be disposed in a portion of the active region. The base substrate 201 may include a semiconductor material, e.g., a Group IV semiconductor material, a Group III-V compound semiconductor material, or a Group II-VI compound semiconductor material.

The circuit elements 230 may include a plane transistor and/or a circuit gate insulating layer 232, a spacer layer 234, and a circuit gate electrode 235. The doped regions 205 are disposed on respective sides of the circuit gate electrode 235 in the base substrate 201 and act as a source region or a drain region of the circuit element 230. The circuit element 230 may be different from a plane transistor or may include a plurality of transistors in another embodiment.

A plurality of peripheral region insulating layers 244 and 246 may be disposed on the circuit element 230 on the base substrate 201.

The contact plugs 250 may be connected to the doped regions 205 through the peripheral region insulating layers 244. An electrical signal may be applied to the circuit element 230 by the contact plugs 250. In a region, the contact plugs 250 may be connected also to the circuit gate electrode 235. The wiring lines 260 may be connected to the contact plugs 250 and may be disposed as a plurality of layers.

The cell region CELL and the peripheral circuit region PERI may be connected in a predetermined region. For example, first ends of the gate electrodes 230 in the x direction may be electrically connected to the circuit element 230.

Figure 15:
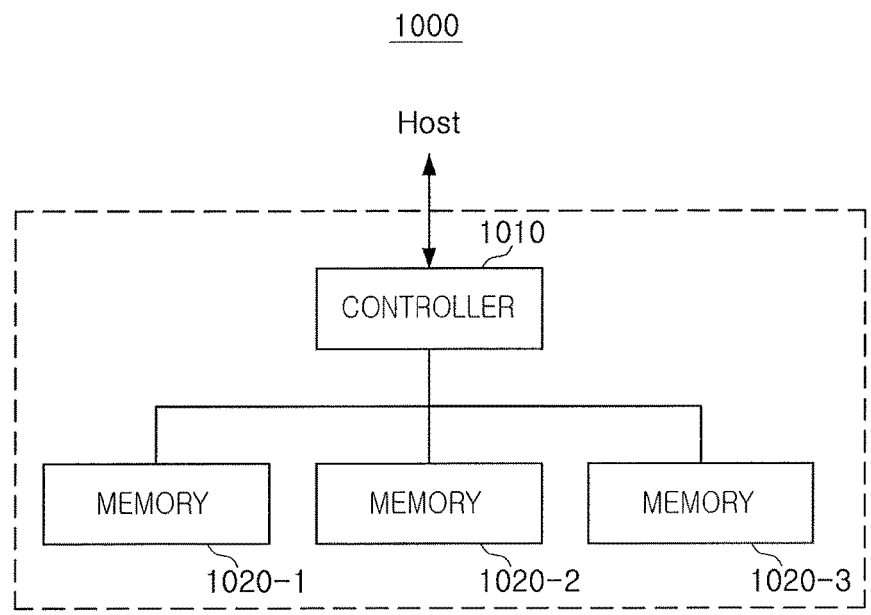
FIG. 15 illustrates an embodiment of a storage device.

FIG. 15 illustrates an embodiment of a storage device 1000 which includes one or more memory devices. Referring to FIG. 15, storage device 1000 may include a controller 1010 communicating with a host HOST and memories 1020-1, 1020-2, and 1020-3 storing data. The memories 1020-1, 1020-2, and 1020-3 may correspond to one or more of the memory devices of the aforementioned embodiments.

The host HOST may be various electronic devices in which the storage device 100 is installed or connected to. For example, the host HOST may be a smartphone, a digital camera, a desktop computer, a laptop computer, a media player, or the like. When a data write or read request is received from the host HOST, the controller 1010 may generate a command CMD for storing data in the memories 1020-1, 1020-2, and 1020-3 or retrieving data from the memories 1020-1, 1020-2, and 1020-3.

As illustrated in FIG. 15, one or more memories 1020-1, 1020-2, and 1020-3 may be connected to the controller 1010 in parallel within the storage device 1000. By connecting the plurality of memories 1020-1, 1020-2, and 1020-3 to the controller 1010 in parallel, the storage device 1000 may be formed to have large capacity, such as a solid state drive (SSD).

Figure 16:
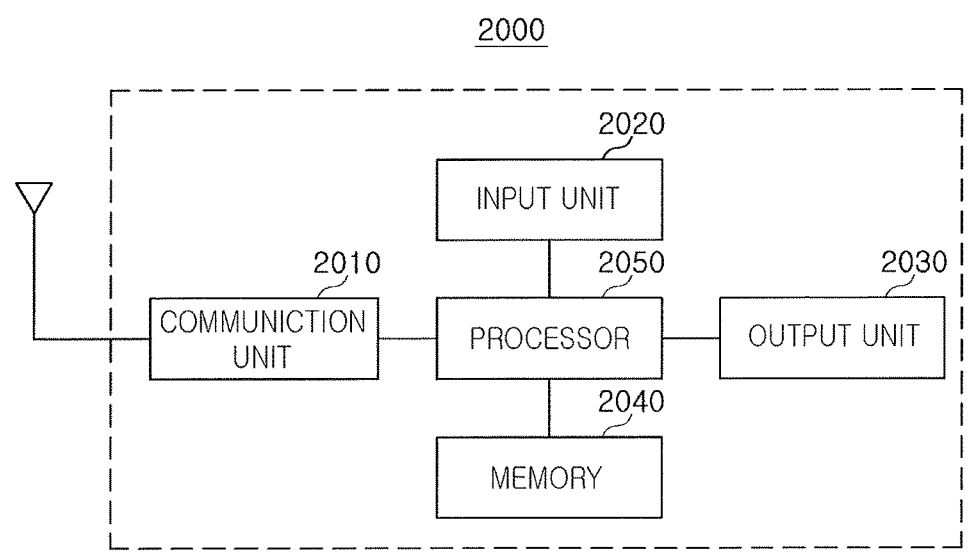
FIG. 16 illustrates an embodiment of an electronic device.

FIG. 16 illustrates an embodiment of an electronic device 2000, which, for example, may include one or more memory devices. The electronic device 2000 may include a communications unit 2010, an input unit 2020, an output unit 2030, a memory 2040, and a processor 2050.

The communications unit 2010 may include a wired/wireless communications module and may include a wireless Internet module, a short-range communications module, a global positioning system (GPS) module, a mobile communications module, and the like. A wired/wireless communications module in the communications unit 2010 may be connected to an external communication network based on various communication standards to transmit and receive data.

The input unit 2010 may allow a user to control an operation of the electronic device 2000 and, for example, may include a mechanical switch, a touchscreen, a voice recognition module, and the like. The input unit 2010 may include, for example, a mouse or a finger mouse device operating in a track ball or a laser pointer manner, or the like. The input unit 2020 may further include various sensor modules for allowing a user to input data.

The output unit 2030 may output information processed by the electronic device 2000 in an audio or video format. The memory 2040 may store a program for processing and controlling the processor 2050, data, or the like. The memory 2040 may include one or more memory devices according to any of the aforementioned embodiments. The processor 2050 may deliver a command to the memory 2040 according to an operation in order to store data to the memory 2040 or retrieve data therefrom.

The memory 2040 may be installed in the electronic device 2000 or communicate with the processor 2050 through a separate interface. When the memory 240 communicates with the processor 2050 through a separate interface, the processor 2050 may store data to the memory 2040 or retrieve data therefrom through various interface standards such as SD, SDHC, SDXC, MICRO SD, USB, or the like.

The processor 2050 controls operations of the components in the electronic device 2000. The processor 2050 may perform controlling and processing related to an audio call, a video call, data communications, and the like, or may perform controlling and processing for multimedia playback and management. Also, the processor 2050 may process information or signals input from the user through the input unit 2020 and may output corresponding results through the output unit 2030. Further, as described above, the processor 2050 may store data required for controlling an operation of the electronic device 2000 to the memory 2040 or retrieve such data therefrom.

Figure 17:
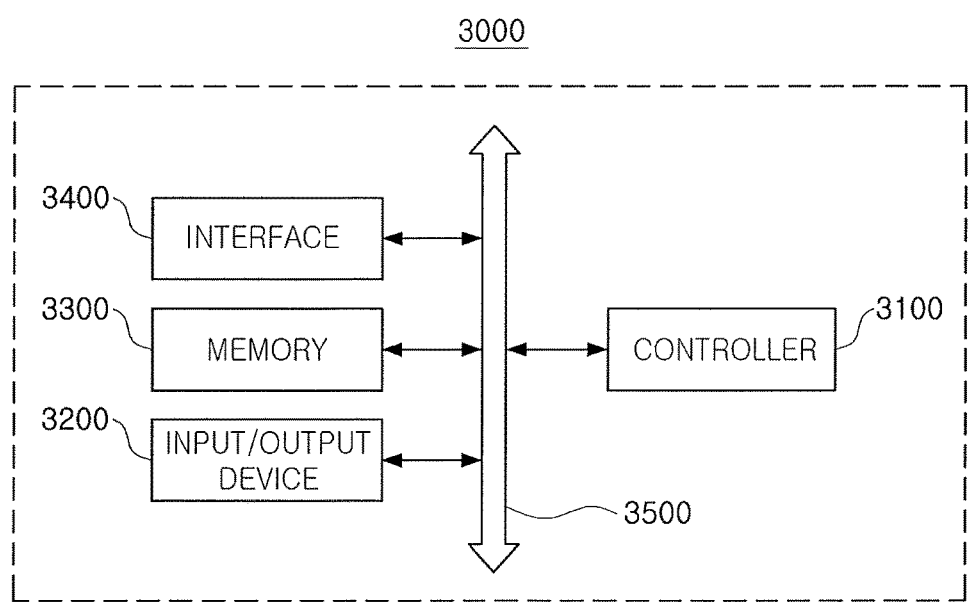
FIG. 17 illustrates an embodiment of an electronic system.

FIG. 17 illustrates an embodiment of an electronic system 300 which includes one or more memory devices. Referring to FIG. 17, the electronic system 3000 may include a controller 3100, an input/output device 3200, a memory 3300, and an interface 3400. The electronic system 3000 may be, for example, a mobile system or a system transmitting or receiving information. The mobile system may be, for example, a portable digital assistant (PDA), a portable computer, a tablet PC, a wireless phone, a mobile phone, a digital music player, or a memory card.

The controller 3100 may execute a program and control the electronic system 3000. The controller 3100 may be, for example, a microprocessor, a digital signal processor, or a microcontroller, or any device similar thereto.

The input/output device 3200 may be used to input or output data of the system 3000. The electronic system 3000 may be connected to an external device, for example, a personal computer or a network and exchange data therewith by using the input/output device 3200. The input/output device 3200 may be, for example, a keypad, a keyboard, or a display.

The memory 3300 may store codes and/or data for an operation of the controller 3100 and/or may store data processed by the controller 3100. The memory 3300 may include one or more memory devices according to the embodiments described herein.

The interface 3400 may be a data transmission passage between the electronic system 3000 and an external device. The controller 3100, the input/output device 3200, the memory 3300, and the interface 3400 may communicate with each other through a bus 3500. At least one of the controller 3100 or the memory 3300 may include a memory device in accordance with the embodiments described herein.

In accordance with another embodiment, a method of manufacturing a memory device includes forming a step structure including an alternating arrangement of gate electrode layers and first insulating layers, forming a second insulating layer on the step structure, the second insulating layer including first areas and second areas, the first areas having different heights over ends of the step structure and the second areas between respective pairs of the first areas, and forming conductive material over the first areas to form contact plugs. These operations may correspond, for example, to operations included in the method corresponding to FIGS. 5A to 5P.

The operation of forming the second insulating layer is illustrated, for example, in FIGS. 5F to 5K. Referring to FIG. 5K, the first areas may correspond to FA and the second areas may correspond to SA. As illustrated, top surfaces of the first areas FA are at different heights, and the second areas SA are between adjacent pairs of the first areas FA. Subsequently, the first areas FA are filled with conductive material to form contact plugs (FIG. 5O).

In accordance with one or more of the example embodiments described herein, contact holes are etched to form contact plugs connected to gate electrode layers in a cell region. During this process, openings are etched in a linear form, thereby improving selectivity of the etching process. Also, a memory device and a method of manufacturing a memory device may be provided in which the occurrence of defective contact plugs are reduced or eliminated and thus reliability of the finished product is enhanced.

In at least one embodiment, hole-type contact holes connected to several gate electrode layers are not etched and a line-type opening is etched. Thus, the thickness of a fluorocarbon ($C_xF_y$) polymer, a passivation material, may be uniformly formed in the entire region of the opening. Thus, etch selectivity regarding the gate electrodes may be uniformly maintained at an appropriate level, thereby preventing the aforementioned defect in which some of the gate electrode layers are penetrated.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. A memory device, comprising:
a plurality of gate electrode layers extending in a first direction, the gate electrode layers having different lengths on a substrate to form a step structure;
an interlayer insulating layer on the gate electrode layers;
a plurality of contact plugs connected to the gate electrode layers through the interlayer insulating layer;
at least one contact insulating layer within the interlayer insulating layer and surrounding one or more of the contact plugs, the at least one contact insulating layer extending in the first direction; and
a plurality of recesses in upper portions of the gate electrode layers, wherein the recesses are in a connection region outside of a cell array region and wherein each of the recesses has a shape corresponding to a shape of an outer surface of the at least one contact insulating layer.

2. The memory device as claimed in claim 1, wherein the at least one contact insulating layer extends along the contact plugs to contact the gate electrode layers.

3. The memory device as claimed in claim 1, wherein the at least one contact insulating layer includes:
a plurality of first regions surrounding outer surfaces of the contact plugs, and
a plurality of second regions connecting the first regions to each other.

4. The memory device as claimed in claim 3, wherein the first regions are arranged in a row in the first direction.

5. The memory device as claimed in claim 3, wherein the first regions are arranged in a zigzag pattern in the first direction.

6. The memory device as claimed in claim 1, wherein depths of the recesses are substantially equal.

7. The memory device as claimed in claim 1, further comprising:
a plurality of contact insulating layers within the interlayer insulating layer and surrounding the contact plugs, wherein the contact plugs are arranged in a plurality of rows in the first direction.

8. The memory device as claimed in claim 1, further comprising:
a plurality of dummy channel columns adjacent to first ends of the gate electrode layers.

9. The memory device as claimed in claim 8, wherein the dummy channel columns are arranged in a plurality of rows in the first direction.

10. A method of manufacturing a memory device, the method comprising:
forming gate electrode layers extending in a first direction, the gate electrode layers having different lengths on a substrate to form a step structure;
forming an interlayer insulating layer on the gate electrode layers;
removing at least a portion of the interlayer insulating layer to form an opening in a connection region outside of a cell array region, the opening including first opening regions and a second opening region connecting the first opening regions to each other and exposing the gate electrode layers;
partially filling the opening with an insulating layer to form contact holes; and
filling the contact holes with a conductive material to form contact plugs.

11. The method as claimed in claim 10, further comprising:
forming a mask pattern including first pattern regions and second pattern regions on the interlayer insulating layer, the first pattern regions disposed to correspond to positions of the contact holes and the second pattern regions connecting the first pattern regions to each other and extending in the first direction, the mask pattern formed before forming the opening.

12. The method as claimed in claim 11, wherein:
each of the second pattern regions have a predetermined width and extend in the first direction, and
a width of each of the first pattern regions is greater than the predetermined width of the second pattern regions.

13. The method as claimed in claim 10, wherein forming the contact holes includes:
forming an insulating layer on a side wall of the opening in such a manner that the first opening regions are partially filled and the second opening regions are entirely filled; and
etching back the insulating layer to expose the gate electrode layers within the first opening regions.

14. The method as claimed in claim 13, wherein a thickness of the insulating layer, with respect to the side wall of the opening, is greater than half of a width of each of the second opening regions and less than half of each of the first opening regions.

15. A memory device, comprising:
a plurality of gate electrode layers extending in a first direction, the gate electrode layers having different lengths on a substrate to form a step structure;
an interlayer insulating layer on the gate electrode layers;
a plurality of contact plugs connected to the gate electrode layers through the interlayer insulating layer;
at least one contact insulating layer within the interlayer insulating layer and surrounding one or more of the contact plugs, the at least one contact insulating layer extending in the first direction; and
a plurality of dummy channel columns adjacent to first ends of the gate electrode layers.

16. The memory device as claimed in claim 15, wherein the dummy channel columns are arranged in a plurality of rows in the first direction.

* * * * *